US008288206B2

(12) United States Patent
Leedy

(10) Patent No.: US 8,288,206 B2
(45) Date of Patent: *Oct. 16, 2012

(54) THREE DIMENSIONAL STRUCTURE MEMORY

(75) Inventor: Glenn J. Leedy, Parkland, FL (US)

(73) Assignee: Elm Technology Corp, Carmel, CA (US)

(*) Notice: Subject to any disclaimer, the term of this patent is extended or adjusted under 35 U.S.C. 154(b) by 367 days.

This patent is subject to a terminal disclaimer.

(21) Appl. No.: 12/497,654

(22) Filed: Jul. 4, 2009

(65) Prior Publication Data
US 2010/0173453 A1 Jul. 8, 2010

Related U.S. Application Data

(60) Continuation of application No. 10/143,200, filed on May 13, 2002, which is a continuation of application No. 09/607,363, filed on Jun. 30, 2000, now Pat. No. 6,632,706, which is a continuation of application No. 08/971,565, filed on Nov. 17, 1997, now Pat. No. 6,133,640, which is a division of application No. 08/835,190, filed on Apr. 4, 1997, now Pat. No. 5,915,167.

(51) Int. Cl.
*H01L 21/44* (2006.01)
(52) U.S. Cl. ......... 438/109; 438/107; 438/618; 438/622
(58) Field of Classification Search .......... 438/106–109, 438/618, 622, 637; 365/51, 63
See application file for complete search history.

(56) References Cited

U.S. PATENT DOCUMENTS

| 2,915,722 A | 12/1959 | Foster |
| 3,202,948 A | 8/1965 | Farrand |
| 3,430,835 A | 3/1969 | Patzer et al. |
| 3,559,282 A | 2/1971 | Lesk |
| 3,560,364 A | 2/1971 | Burkhardt |
| 3,602,982 A | 9/1971 | Kooi |
| 3,615,901 A | 10/1971 | Medicus |
| 3,636,358 A | 1/1972 | Groschwitz |
| 3,716,429 A | 2/1973 | Napoli et al. |
| 3,777,227 A | 12/1973 | Krishna et al. |
| 3,780,352 A | 12/1973 | Redwanz |

(Continued)

FOREIGN PATENT DOCUMENTS

DE 3233195 3/1983

(Continued)

OTHER PUBLICATIONS

Aboaf, J.A., "Stresses in SiO2 Films Obtained from the Thermal Decomposition of Tetraethylorthosilicate—Effect of Heat Treatment and Humidity," J. Electrochem. Soc.: Solid State Science; 116(12): 1732-1736 (Dec. 1969).

(Continued)

*Primary Examiner* — Kevin M Picardat
(74) *Attorney, Agent, or Firm* — Useful Arts IP

(57) ABSTRACT

A Three-Dimensional Structure (3DS) Memory allows for physical separation of the memory circuits and the control logic circuit onto different layers such that each layer may be separately optimized. One control logic circuit suffices for several memory circuits, reducing cost. Fabrication of 3DS memory involves thinning of the memory circuit to less than 50 μm in thickness and bonding the circuit to a circuit stack while still in wafer substrate form. Fine-grain high density inter-layer vertical bus connections are used. The 3DS memory manufacturing method enables several performance and physical size efficiencies, and is implemented with established semiconductor processing techniques.

94 Claims, 9 Drawing Sheets

U.S. PATENT DOCUMENTS

| | | |
|---|---|---|
| 3,868,565 A | 2/1975 | Kuipers |
| 3,922,705 A | 11/1975 | Yeman |
| 3,932,932 A | 1/1976 | Goodman |
| 3,997,381 A | 12/1976 | Wanlass |
| 4,028,547 A | 6/1977 | Eisenberger |
| 4,070,230 A | 1/1978 | Stein |
| 4,089,063 A | 5/1978 | Takezono et al. |
| 4,131,985 A | 1/1979 | Greenwood et al. |
| 4,142,004 A | 2/1979 | Hauser, Jr. et al. |
| 4,196,232 A | 4/1980 | Schnable et al. |
| 4,246,595 A | 1/1981 | Noyori et al. |
| 4,249,302 A | 2/1981 | Crepeau |
| 4,251,909 A | 2/1981 | Hoeberechts |
| 4,262,631 A | 4/1981 | Kubacki |
| 4,393,127 A | 7/1983 | Greschner et al. |
| 4,394,401 A | 7/1983 | Shioya et al. |
| 4,401,986 A | 8/1983 | Trenkler et al. |
| 4,416,054 A | 11/1983 | Thomas et al. |
| 4,464,747 A | 8/1984 | Groudan et al. |
| 4,500,905 A | 2/1985 | Shibata |
| 4,528,072 A | 7/1985 | Kurosawa et al. |
| 4,539,068 A | 9/1985 | Takagi et al. |
| 4,566,037 A | 1/1986 | Takatsu et al. |
| 4,585,991 A | 4/1986 | Reid et al. |
| 4,604,162 A | 8/1986 | Sobczak |
| 4,612,083 A | 9/1986 | Yasumoto et al. |
| 4,617,160 A | 10/1986 | Belanger et al. |
| 4,618,397 A | 10/1986 | Shimizu et al. |
| 4,618,763 A | 10/1986 | Schmitz |
| 4,622,632 A | 11/1986 | Tanimoto et al. |
| 4,663,559 A | 5/1987 | Christensen |
| 4,684,436 A | 8/1987 | Burns et al. |
| 4,693,770 A | 9/1987 | Hatada |
| 4,702,336 A | 10/1987 | Seibert et al. |
| 4,702,936 A | 10/1987 | Maeda et al. |
| 4,706,166 A | 11/1987 | Go |
| 4,721,938 A | 1/1988 | Stevenson |
| 4,724,328 A | 2/1988 | Lischke |
| 4,761,681 A | 8/1988 | Reid |
| 4,766,670 A | 8/1988 | Gadzik et al. |
| 4,784,721 A | 11/1988 | Holmen et al. |
| 4,810,673 A | 3/1989 | Freeman |
| 4,810,889 A | 3/1989 | Yokomatsu et al. |
| 4,825,277 A | 4/1989 | Mattox et al. |
| 4,835,765 A | 5/1989 | Bergmans et al. |
| 4,849,857 A | 7/1989 | Butt et al. |
| 4,855,867 A | 8/1989 | Gadzik et al. |
| 4,857,481 A | 8/1989 | Tam et al. |
| 4,890,157 A | 12/1989 | Wilson |
| 4,892,753 A | 1/1990 | Wang et al. |
| 4,897,708 A | 1/1990 | Clements |
| 4,919,749 A | 4/1990 | Mauger et al. |
| 4,924,589 A | 5/1990 | Leedy |
| 4,928,058 A | 5/1990 | Williamson |
| 4,934,799 A | 6/1990 | Chu |
| 4,939,568 A | 7/1990 | Kato et al. |
| 4,939,694 A | 7/1990 | Eaton et al. |
| 4,940,916 A | 7/1990 | Borel et al. |
| 4,950,987 A | 8/1990 | Vranish et al. |
| 4,952,446 A | 8/1990 | Lee et al. |
| 4,954,865 A | 9/1990 | Rokos |
| 4,954,875 A | 9/1990 | Clements |
| 4,957,882 A | 9/1990 | Shinomiya |
| 4,965,415 A | 10/1990 | Young et al. |
| 4,966,663 A | 10/1990 | Mauger |
| 4,983,251 A | 1/1991 | Haisma et al. |
| 4,990,462 A | 2/1991 | Sliwa |
| 4,994,336 A | 2/1991 | Benecke et al. |
| 4,994,735 A | 2/1991 | Leedy |
| 5,000,113 A | 3/1991 | Wang et al. |
| 5,008,619 A | 4/1991 | Keogh et al. |
| 5,010,024 A | 4/1991 | Allen et al. |
| 5,020,219 A | 6/1991 | Leedy |
| 5,034,685 A | 7/1991 | Leedy |
| 5,051,326 A | 9/1991 | Celler et al. |
| 5,062,689 A | 11/1991 | Koehler |
| 5,064,275 A | 11/1991 | Tsunoda et al. |
| 5,070,026 A | 12/1991 | Greenwald et al. |
| 5,071,510 A | 12/1991 | Findler et al. |
| 5,098,865 A | 3/1992 | Machado et al. |
| 5,103,557 A | 4/1992 | Leedy |
| 5,109,360 A | 4/1992 | Inazumi et al. |
| 5,110,373 A | 5/1992 | Mauger |
| 5,110,712 A | 5/1992 | Kessler et al. |
| 5,111,278 A | 5/1992 | Eichelberger |
| 5,116,777 A | 5/1992 | Chan et al. |
| 5,117,282 A | 5/1992 | Salatino |
| 5,119,164 A | 6/1992 | Sliwa et al. |
| 5,130,894 A | 7/1992 | Miller |
| 5,132,244 A | 7/1992 | Roy |
| 5,144,142 A | 9/1992 | Fueki et al. |
| 5,151,775 A | 9/1992 | Hadwin |
| 5,156,909 A | 10/1992 | Henager, Jr. et al. |
| 5,166,962 A | 11/1992 | Murooka et al. |
| 5,169,805 A | 12/1992 | Mok et al. |
| 5,188,706 A | 2/1993 | Hori et al. |
| 5,198,965 A | 3/1993 | Curtis et al. |
| 5,203,731 A | 4/1993 | Zimmerman |
| 5,225,771 A | 7/1993 | Leedy |
| 5,236,118 A | 8/1993 | Bower et al. |
| 5,240,458 A | 8/1993 | Linglain et al. |
| 5,241,454 A | 8/1993 | Ameen et al. |
| 5,245,277 A | 9/1993 | Nguyen |
| 5,255,227 A | 10/1993 | Haeffele |
| 5,259,247 A | 11/1993 | Bantien |
| 5,262,341 A | 11/1993 | Fueki et al. |
| 5,262,351 A | 11/1993 | Bureau et al. |
| 5,270,261 A | 12/1993 | Bertin et al. |
| 5,273,940 A | 12/1993 | Sanders |
| 5,274,270 A | 12/1993 | Tuckerman |
| 5,279,865 A | 1/1994 | Chebi et al. |
| 5,283,107 A | 2/1994 | Bayer et al. |
| 5,284,796 A | 2/1994 | Nakanishi et al. |
| 5,284,804 A | 2/1994 | Moslehi |
| 5,293,457 A | 3/1994 | Arima et al. |
| 5,321,884 A | 6/1994 | Ameen et al. |
| 5,323,035 A | 6/1994 | Leedy |
| 5,324,687 A | 6/1994 | Wojnarowski |
| 5,343,366 A | 8/1994 | Cipolla et al. |
| 5,347,428 A | 9/1994 | Carson et al. |
| 5,354,695 A | 10/1994 | Leedy |
| 5,357,473 A | 10/1994 | Mizuno |
| 5,358,909 A | 10/1994 | Hashiguchi et al. |
| 5,363,021 A | 11/1994 | MacDonald |
| 5,374,940 A | 12/1994 | Corio |
| 5,385,632 A | 1/1995 | Goossen |
| 5,385,909 A | 1/1995 | Nelson et al. |
| 5,399,505 A | 3/1995 | Dasse et al. |
| RE34,893 E | 4/1995 | Fujii et al. |
| 5,420,458 A | 5/1995 | Shimoji |
| 5,424,920 A | 6/1995 | Miyake |
| 5,426,072 A | 6/1995 | Finnila |
| 5,426,363 A | 6/1995 | Akagi et al. |
| 5,432,444 A | 7/1995 | Yasohama et al. |
| 5,432,729 A | 7/1995 | Carson et al. |
| 5,432,999 A | 7/1995 | Capps et al. |
| 5,434,500 A | 7/1995 | Hauck et al. |
| 5,448,106 A | 9/1995 | Fujitsu |
| 5,450,603 A | 9/1995 | Davies |
| 5,451,489 A | 9/1995 | Leedy |
| 5,453,404 A | 9/1995 | Leedy |
| 5,457,879 A | 10/1995 | Gurtler et al. |
| 5,463,246 A | 10/1995 | Matsunami |
| 5,470,693 A | 11/1995 | Sachdev et al. |
| 5,476,813 A | 12/1995 | Naruse |
| 5,480,842 A | 1/1996 | Clifton et al. |
| 5,481,133 A | 1/1996 | Hsu |
| 5,489,554 A | 2/1996 | Gates |
| 5,502,667 A | 3/1996 | Bertin et al. |
| 5,512,397 A | 4/1996 | Leedy |
| 5,514,628 A | 5/1996 | Enomoto et al. |
| 5,517,457 A | 5/1996 | Sakui et al. |
| 5,527,645 A | 6/1996 | Pati et al. |
| 5,529,829 A | 6/1996 | Koskenmaki et al. |
| 5,534,465 A | 7/1996 | Frye et al. |
| 5,555,212 A | 9/1996 | Toshiaki et al. |
| 5,563,084 A | 10/1996 | Ramm et al. |

| | | |
|---|---|---|
| 5,571,741 A | 11/1996 | Leedy |
| 5,572,689 A | 11/1996 | Gallup et al. |
| 5,577,050 A | 11/1996 | Bair et al. |
| 5,580,687 A | 12/1996 | Leedy |
| 5,581,498 A | 12/1996 | Ludwig et al. |
| 5,582,939 A | 12/1996 | Pierrat |
| 5,583,688 A | 12/1996 | Hornbeck |
| 5,592,007 A | 1/1997 | Leedy |
| 5,592,018 A | 1/1997 | Leedy |
| 5,595,933 A | 1/1997 | Heijboer |
| 5,606,186 A | 2/1997 | Noda |
| 5,615,163 A | 3/1997 | Sakui et al. |
| 5,620,915 A | 4/1997 | Chen et al. |
| 5,627,112 A | 5/1997 | Tennant et al. |
| 5,629,137 A | 5/1997 | Leedy |
| 5,633,209 A | 5/1997 | Leedy |
| 5,637,536 A | 6/1997 | Val |
| 5,637,907 A | 6/1997 | Leedy |
| 5,654,127 A | 8/1997 | Leedy |
| 5,654,220 A | 8/1997 | Leedy |
| 5,656,552 A | 8/1997 | Hudak et al. |
| 5,661,339 A | 8/1997 | Clayton |
| 5,675,185 A | 10/1997 | Chen et al. |
| 5,691,945 A | 11/1997 | Liou et al. |
| 5,694,588 A | 12/1997 | Ohara et al. |
| 5,715,144 A | 2/1998 | Ameen et al. |
| 5,725,995 A | 3/1998 | Leedy |
| 5,733,814 A | 3/1998 | Flesher et al. |
| 5,736,448 A | 4/1998 | Saia et al. |
| 5,745,076 A | 4/1998 | Turlington et al. |
| 5,745,673 A | 4/1998 | Di Zenzo et al. |
| 5,750,211 A | 5/1998 | Weise et al. |
| 5,753,536 A | 5/1998 | Sugiyama et al. |
| 5,760,478 A | 6/1998 | Bozso et al. |
| 5,764,577 A | 6/1998 | Johnston et al. |
| 5,764,878 A | 6/1998 | Kablanian et al. |
| 5,773,152 A | 6/1998 | Okonogi |
| 5,777,379 A | 7/1998 | Karavakis et al. |
| 5,786,116 A | 7/1998 | Rolfson |
| 5,786,629 A | 7/1998 | Faris |
| 5,787,445 A | 7/1998 | Daberko |
| 5,793,115 A | 8/1998 | Zavracky et al. |
| 5,818,748 A | 10/1998 | Bertin et al. |
| 5,831,280 A | 11/1998 | Ray |
| 5,834,334 A | 11/1998 | Leedy |
| 5,840,593 A | 11/1998 | Leedy |
| 5,847,929 A | 12/1998 | Bernier et al. |
| 5,856,695 A | 1/1999 | Ito et al. |
| 5,868,949 A | 2/1999 | Sotokawa et al. |
| 5,869,354 A | 2/1999 | Leedy |
| 5,870,176 A | 2/1999 | Sweatt et al. |
| 5,880,010 A | 3/1999 | Davidson |
| 5,882,532 A | 3/1999 | Field et al. |
| 5,892,271 A | 4/1999 | Takeda et al. |
| 5,902,118 A | 5/1999 | Hubner |
| 5,915,167 A | 6/1999 | Leedy |
| 5,940,031 A | 8/1999 | Turlington et al. |
| 5,946,559 A | 8/1999 | Leedy |
| 5,985,693 A | 11/1999 | Leedy |
| 5,998,069 A | 12/1999 | Cutter |
| 6,008,126 A | 12/1999 | Leedy |
| 6,017,658 A | 1/2000 | Rhee et al. |
| 6,020,257 A | 2/2000 | Leedy |
| 6,023,098 A | 2/2000 | Higshiguchi et al. |
| RE36,623 E | 3/2000 | Wang et al. |
| 6,045,625 A | 4/2000 | Houston |
| 6,050,832 A | 4/2000 | Lee et al. |
| 6,084,284 A | 7/2000 | Adamic, Jr. |
| 6,087,284 A | 7/2000 | Brix et al. |
| 6,092,174 A | 7/2000 | Roussakov |
| 6,097,096 A | 8/2000 | Gardner et al. |
| 6,133,626 A | 10/2000 | Hawke et al. |
| 6,133,640 A | 10/2000 | Leedy |
| 6,154,809 A | 11/2000 | Ikenaga et al. |
| 6,194,245 B1 | 2/2001 | Tayanaka |
| 6,197,456 B1 | 3/2001 | Aleshin et al. |
| 6,208,545 B1 | 3/2001 | Leedy |
| 6,230,233 B1 | 5/2001 | Lofgren |
| 6,236,602 B1 | 5/2001 | Pati |
| 6,261,728 B1 | 7/2001 | Lin |
| 6,288,561 B1 | 9/2001 | Leedy |
| 6,294,909 B1 | 9/2001 | Leedy |
| 6,300,935 B1 | 10/2001 | Sobel et al. |
| 6,301,653 B1 | 10/2001 | Mohamed et al. |
| 6,320,593 B1 | 11/2001 | Sobel et al. |
| 6,335,491 B1 | 1/2002 | Alagaratnam et al. |
| 6,355,976 B1 | 3/2002 | Faris |
| RE37,637 E | 4/2002 | Clifton et al. |
| 6,392,304 B1 | 5/2002 | Butler |
| 6,445,006 B1 | 9/2002 | Brandes et al. |
| 6,518,073 B2 | 2/2003 | Momohara |
| 6,551,857 B2 | 4/2003 | Leedy |
| 6,563,224 B2 | 5/2003 | Leedy |
| 6,632,706 B1 | 10/2003 | Leedy |
| 6,682,981 B2 | 1/2004 | Leedy |
| 6,713,327 B2 | 3/2004 | Leedy |
| 6,714,625 B1 | 3/2004 | Leedy |
| 6,765,279 B2 | 7/2004 | Leedy |
| 6,838,896 B2 | 1/2005 | Leedy |
| 6,891,387 B2 | 5/2005 | Leedy |
| 6,894,392 B1 | 5/2005 | Gudesen et al. |
| 7,138,295 B2 | 11/2006 | Leedy |
| 7,193,239 B2 | 3/2007 | Leedy |
| 7,307,020 B2 | 12/2007 | Leedy |
| 7,385,835 B2 | 6/2008 | Leedy |
| 7,402,897 B2 | 7/2008 | Leedy |
| 7,474,004 B2 | 1/2009 | Leedy |
| 7,479,694 B2 | 1/2009 | Leedy |
| 7,485,571 B2 | 2/2009 | Leedy |
| 7,504,732 B2 | 3/2009 | Leedy |
| 7,550,805 B2 | 6/2009 | Leedy |
| 7,615,837 B2 | 11/2009 | Leedy |
| 7,670,893 B2 | 3/2010 | Leedy |
| 7,705,466 B2 | 4/2010 | Leedy |
| 7,736,948 B2 | 6/2010 | Dekker et al. |
| 7,763,948 B2 | 7/2010 | Leedy |
| 2001/0002711 A1 | 6/2001 | Gonzalez |
| 2002/0127775 A1 | 9/2002 | Haba et al. |
| 2002/0132465 A1 | 9/2002 | Leedy |
| 2003/0011032 A1 | 1/2003 | Umebayashi |
| 2003/0173608 A1 | 9/2003 | Leedy |
| 2004/0000708 A1 | 1/2004 | Rapport et al. |
| 2004/0070063 A1 | 4/2004 | Leedy |
| 2004/0245617 A1 | 12/2004 | Damberg et al. |
| 2008/0237591 A1 | 10/2008 | Leedy |
| 2008/0251941 A1 | 10/2008 | Leedy |
| 2008/0254572 A1 | 10/2008 | Leedy |
| 2008/0284611 A1 | 11/2008 | Leedy |
| 2008/0302559 A1 | 12/2008 | Leedy |
| 2009/0067210 A1 | 3/2009 | Leedy |
| 2009/0174082 A1 | 7/2009 | Leedy |
| 2009/0175104 A1 | 7/2009 | Leedy |
| 2009/0194768 A1 | 8/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0148371 A1 | 6/2010 | Kaskoun et al. |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |
| 2011/0042829 A1 | 2/2011 | Kaskoun et al. |

FOREIGN PATENT DOCUMENTS

| | | |
|---|---|---|
| EP | 0189976 | 8/1986 |
| EP | 0201380 | 12/1986 |
| EP | 0224418 | 6/1987 |
| EP | 0238089 | 9/1987 |
| EP | 0314437 | 5/1989 |
| EP | 0419898 | 4/1991 |
| EP | 0455455 | 11/1991 |
| EP | 0487302 | 5/1992 |
| EP | 0503816 | 9/1992 |
| EP | 0518283 | 12/1992 |
| EP | 0518774 | 12/1992 |

| | | |
|---|---|---|
| EP | 0526551 | 2/1993 |
| EP | 0554063 | 8/1993 |
| EP | 0555252 | 8/1993 |
| EP | 0703618 | 3/1996 |
| EP | 0703619 | 3/1996 |
| EP | 0731525 | 9/1996 |
| FR | 2641129 | 6/1990 |
| GB | 2125168 | 2/1984 |
| GB | 2215168 | 2/1984 |
| JP | 6074643 | 4/1985 |
| JP | 60126871 | 7/1985 |
| JP | 6130059 | 2/1986 |
| JP | 62272556 | 11/1987 |
| JP | 63076484 | 4/1988 |
| JP | 01199476 | 9/1988 |
| JP | 63229862 | 9/1988 |
| JP | 01157561 | 6/1989 |
| JP | 02027600 | 1/1990 |
| JP | 02037655 | 2/1990 |
| JP | 02082564 | 3/1990 |
| JP | 2239627 A | 9/1990 |
| JP | 03127816 | 5/1991 |
| JP | 03174715 | 7/1991 |
| JP | 03284871 | 12/1991 |
| JP | 4010649 A | 1/1992 |
| JP | 04042957 | 2/1992 |
| JP | 04076946 | 3/1992 |
| JP | 04083371 | 3/1992 |
| JP | 04107964 | 4/1992 |
| JP | 04196263 | 7/1992 |
| JP | 456956 A | 12/1992 |
| JP | 05109977 | 4/1993 |
| JP | 05283607 | 10/1993 |
| JP | 08017962 | 1/1996 |
| JP | 09152979 | 6/1997 |
| JP | 10107065 | 4/1998 |
| JP | 10209371 | 8/1998 |
| JP | 261001 A | 9/1999 |
| WO | WO8910255 | 11/1989 |
| WO | WO9009093 | 8/1990 |
| WO | WO9105366 | 4/1991 |
| WO | WO9203848 | 3/1992 |
| WO | WO9217901 | 10/1992 |
| WO | 9413121 | 6/1994 |
| WO | 9509438 | 4/1995 |
| WO | 9641204 | 12/1996 |
| WO | WO9641264 | 12/1996 |
| WO | WO9819337 | 5/1998 |
| WO | WO03078305 | 9/2003 |

OTHER PUBLICATIONS

Allen, Mark G.; Senturia, Stephen D.; "Measurement of polyimide interlayer adhesion using microfabricated structures"; 1988; pp. 352-356.
Alloert, K., et al., "A Comparison Between Silicon Nitride Films Made by PCVD of N2-SiH4/Ar and N2-SiH4/He," Journal of the Electrochemical Society, vol. 132, No. 7, pp. 1763-1766, (Jul. 1985).
Bailey, R., "Glass for Solid-State Devices: Glass film has low intrinsic compressive stress for isolating active layers of magnetic-bubble and other solid-state devices," NASA Tech Brief (1982).
Boyer, P.K.; Collins, G.J.; Moore, C.A.; Ritchie, W.K.; Roche, G.A.; Solanski, R. (A); Tang, C.C.; Microelectronic thin film deposition by ultraviolet laser photolysis Monograph Title—Laser processing of semiconductor.
Boyer, P.K.; Collins, G.J.; Moore, C.A.; Solanski, R.; Ritchie, W.K.; Roche, G.A.; Collins, G.J.; "Laser photolytic deposition of thin films"; 1983; pp. 119-127.
Chang, E.Y.; Cibuzar, G.T.; Pande, K.P.; "Passivation of GaAs FETs with PECVD silicon nitride films of different stress states"; Sep. 1988; pp. 1412-1418.
Chen, Y.S.; Fatemik, H.; "stress measurements on multilevel thin film dielectric layers used in Si integrated circuits"; May-Jun. 1986; pp. 645-649.
"Christensens Physics of Diagnostic Radiology," Currey et al., pp. 29-33, 1990.
Draper, B.L.; Hill, T.A.; "Stress and stress relaxation in integrated circuit metals and dielectrics"; Jul.-Aug. 1991; pp. 1956-1962.
Garino, T.J.; Harrington, H.M.; "Residual stress in PZT films and its effect on ferroelectric properties"; 1992; pp. 341-347.
Guckel, H.; "Surface micromachined pressure transducers"; 1991; pp. 133-146.
Hendricks et al., "Polyquinoline Coatings and Films: Improved Organic Dielectrics for ICs and MCMs," Eleventh IEEE/CHMT International Electronics Manufacturing Technology Symposium, pp. 361-365 (1991).
Hsieh, et al., "Directional Deposition of Dielectric Silicon Oxide by Plasma Enhanced TEOS Process," 1989 Proceedings, Sixth International IEEE VLSI Multilevel Interconnection Conference, pp. 411-415 (1989).
"Partitioning Function and Packaging of Integrated Circuits for Physical Security of Data," IBM Technical Disclosure Bulletin, IBM Corp.; 32(1): 46-49 (Jun. 1989).
Jones, R.E., Jr. "An evaluation of methods for passivating silicon integrated circuits"; Apr. 1972; pp. 23-28.
Knolle, W.R., et al., "Characterization of Oxygen-Doped, Plasma-Deposited Silicon Nitride," Journal of the Electrochemical Society, vol. 135, No. 5, pp. 1211-1217, (May 1988).
Kochugova, I.V.; Nikolaeva, L.V.; Vakser, N.M., (M.I. Kalinin Leningrad Polytechnic Institute (USSR); "Electrophysical investigation of thin-layered inorganic coatings"; 1989; pp. 826-828.
Mitsumasa Koyanagi et al.; "Design of 4-DBIT ×4-layer Optically Coupled Three-Dimensional Common Memory for Parallel Processor System," IEEE Journal of Solid-State Circuits, vol. 25, No. 1, Feb. 1, 1990.
Krishnamoorthy, et al., "3-D Integration of MQW Modulators Over Active Submicron CMOS Circuits: 375 Mb/s Transimpedance Receiver-Transmitter Circuit," IEEE Photonics Technology Letters, 2(11): 1288-1290 (Nov. 1991.
Maw, T.; Hopla, R.E.; "Properties of a photoimageable thin polyimide film"; Nov. 26-29, 1990; pp. 71-76.
"Miniature Electron Microscopes Without Vacuum Pumps, Self-Contained Microfabricated Devices with Short Working Distances, Enable Operation in Air," NASA Tech Briefs, 39-40 (1998).
Nguyen, S.V., Plasma Assisted Chemical Vapor Deposited Thin Films for Microelectronic Applications, J. Vac. Sci. Technol. vol. B4, No. 5, pp. 1159-1167, (Sep./Oct. 1986).
Olmer, et al., "Intermetal Dielectric Deposition by Plasma Enhanced Chemical Vapor Deposition," Fifth IEEE/CHMT International Electronic Manufacturing Technology Symposium—Design-to-Manufacturing Transfer Cycle, pp. 98-99, 1988.
Pei-lin Pai; Chetty, A.; Roat, R.; Cox, N.; Chiu Ting; "Material characteristics of spin-on glassesfor interlayer dielectric applications"; Nov. 1987, pp. 2829-2834.
Pai, Pei-Lin; "Multilevel Interconnection Technologies—A Framework and Examples"; 1987; pp. 1871.
Partial European Search Report for Application No. EP 02009643 (Oct. 8, 2002).
Phys. Rev. B., Condens, Matter Mater. Phys. (USA), Physical Review B (Condensed Matter and Materials Physics), Mar. 15, 2003, APS through AIP, USA.
Reche, J.J.H.; "Control of thin film materials properties used in high density multichip interconnect"; Apr. 24-28, 1989; p. 494.
Riley, P.E.; Shelley, A.; "Characterization of a spin-applied dielectric for use in multilevel metallization"; May 1988; pp. 1207-1210.
Runyan, W.R., "Deposition of Inorganic Thin Films," Semiconductor Integrated Circuit Processing Technology, p. 142 (1990).
Salazar, M.; Wilkins, C.W., Jr.; Ryan, V.W.; Wang, T.T.; "low stress films of cyclized polybutadiene dielectrics by vacuum annealing"; Oct. 21-22, 1986; pp. 96-102.
Scheuerman, R.J., "Fabrication of Thin Dielectric Films with Low Internal Stresses," J. Vac. Sci. and Tech., 7(1): 143-146 (1970).
"IC Tower Patent: Simple Technology Receives Patent on the IC Tower, a Stacked Memory Technology," http://www.simpletech.com/whatsnew/memory/@60824.htm (1998).
Sun, R.C.; Tisone, T.C.; Cruzan, P.D.; "Internal stresses and resistivity of low-voltage sputtered tungsten films (microelectronic cct. conductor)"; Mar. 1973; pp. 1009-1016.

Sung et al., "Well-aligned carbon nitride nanotubes synthesized in anodic alumina by electron cyclotron resonance chemical vapor deposition," Applied Physics Letters, vol. 74, No. 2, 197, Jan. 11, 1999.

Svechnikov, S.V.; Kobylyatskaya, M.F.; Kimarskii, V.I.; Kaufman, A.P.; Kuzolvlev, Yu.I.; Cherepov, Ye. I.; Fomin, B.I.; "A switching plate with aluminum membrane crossings of conductors"; 1972.

Sze, S.M., "surface Micromachining," Semiconductor Sensors, pp. 58-63 (1994).

Tamura, H.; Nishikawa, T.; Wakino, K.; Sudo, T.; "Metalized MIC substrates using high K dielectric resonator materials": Oct. 1988; pp. 117-126.

Tessler, et al., "An Overview of Dielectric Materials for Multichip Modules," SPE, Electrical & Electronic Div.; (6): 260-269 (1991).

Tielert, et al., "Benefits of Vertically Stacked Integrated Circuits for Sequential Logic," IEEE, XP-000704550, 121-124 (Dec. 5, 1996).

Townsend, P.H.; Huggins, R.A.; "Stresses in borophosilicate glass films during thermal cycling"; Oct. 21-22, 1986; pp. 134-141.

Treichel, et al., "Planaized Low-Stress Oxide/Nitride Passivation for ULSI Devices," J. Phys IV, Colloq. (France), 1 (C2): 839-846 (1991).

Vossen, John L., "Plasma-Enhanced Chemical Vapor Deposition," Thin Film Processes II, pp. 536-541 (1991).

Wade, T.E.; "low temperature double-exposed polyimide/oxide dielectric for VLSI multilevel metal interconnection"; 1982; pp. 516-519.

S. Wolf, Silicon Processing, 1990, Lattice Press, vol. 2, p. 111.

Wolf, Stanley and Richard N. Tauber; Silicon Processing for the VLSI Era, vol. 1: Process Technology; Sunset Beach, CA; Lattice Press, 1986, pp. 191-194.

Wolf, Stanley, "Basics of Thin Films," Silicon Processing for the VLSI Era, pp. 115, 192, 193, and 199 (1986).

Smith et al., Generation of Minimal Vertex Covers for Row/Column Allocation in Self-Repairable Arrays, IEEE Transactions on Computers, vol. 45, No. 1, Jan. 1996, pp. 109-115.

Chu et al., ed., 3D Packaging for Integrated Circuit Systems, Sandia Report SAND96-2801, UC-704, Nov. 1996.

Hayashi et al., A New Three Dimensional IC Fabrication Technology, Stacking Thin Film Dual-CMOS Layers, NEC Microelectronics Research Laboratories, 1991 IEEE.

Koyanagi, Different Approaches to 3D Chips, Dept. of Bioengineering and Robotics, Tohoku University, Japan, pp. 10, 11, 13, 14, 16, 19.

THREE DIMENSIONAL STRUCTURE MEMORY

RELATED APPLICATIONS

This application is a continuation of U.S. Ser. No. 10/143,200 filed May 13, 2002, which is a continuation of U.S. Ser. No. 09/607,363 filed Jun. 30, 2000, now U.S. Pat. No. 6,632,706, which is a continuation of U.S. Ser. No. 08/971,565 filed Nov. 17, 1997, now U.S. Pat. No. 6,133,640, which is a divisional of U.S. Ser. No. 08/835,190 filed Aug. 4, 1997, now U.S. Pat. No. 5,915,167, all of which are incorporated herein by reference.

BACKGROUND OF THE INVENTION

1. Field of the Invention

The present invention relates to stacked integrated circuit memory.

2. State of the Art

Manufacturing methods for increasing the performance and decreasing the cost of electronic circuits, nearly without exception, are methods that increase the integration of the circuit and decrease its physical size per equivalent number of circuit devices such as transistors or capacitors. These methods have produced as of 1996 microprocessors capable of over 100 million operations per second that cost less than $1,000 and 64 Mbit DRAM circuits that access data in less than 50 ns and cost less than $50. The physical size of such circuits is less than 2 cm$^2$. Such manufacturing methods support to a large degree the economic standard of living in the major industrialized countries and will most certainly continue to have significant consequences in the daily lives of people all over the world.

Circuit manufacturing methods take two primary forms: process integration and assembly integration. Historically the line between these two manufacturing disciplines has been clear, but recently with the rise in the use of MCMs (Multi-Chip Modules) and flip-chip die attach, this clear separation may soon disappear. (The predominate use of the term Integrated Circuit (IC) herein is in reference to an Integrated Circuit in singulated die form as sawed from a circuit substrate such as s semiconductor wafer versus, for example, an Integrated Circuit in packaged form.) The majority of ICs when in initial die form are presently individually packaged, however, there is an increasing use of MCMs. Die in an MCM are normally attached to a circuit substrate in a planar fashion with conventional IC die I/O interconnect bonding methods such as wire bonding, DCA (Direct Chip Attach) or FCA (Flip-Chip Attach).

Integrated circuit memory such as DRAM, SRAM, flash EPROM, EEPROM, Ferroelectric, GMR (Giant MagnetoResistance), etc. have the common architectural or structural characteristic of being monolithic with the control circuitry integrated on the same die with the memory array circuitry. This established (standard or conventional) architecture or circuit layout structure creates a design trade-off constraint between control circuitry and memory array circuitry for large memory circuits. Reductions in the fabrication geometries of memory cell circuitry has resulted in denser and denser memory ICs, however, these higher memory densities have resulted in more sophisticated control circuitry at the expense of increased area of the IC. Increased IC area means at least higher fabrication costs per IC (fewer ICs per wafer) and lower IC yields (fewer working ICs per wafer), and in the worst case, an IC design that cannot be manufactured due to its non-competitive cost or unreliable operation.

As memory density increases and the individual memory cell size decreases more control circuitry is required. The control circuitry of a memory IC as a percentage of IC area in some cases such as DRAMs approaches or exceeds 40%. One portion of the control circuitry is the sense amp which senses the state, potential or charge of a memory cell in the memory array circuitry during a read operation. The sense amp circuitry is a significant portion of the control circuitry and it is a constant challenge to the IC memory designer to improve sense amp sensitivity in order to sense ever smaller memory cells while preventing the area used by the sense amp from becoming too large.

If this design constraint or trade-off between control and memory circuits did not exist, the control circuitry could be made to perform numerous additional functions, such as sensing multiple storage states per memory cell, faster memory access through larger more sensitive sense amps, caching, refresh, address translation, etc. But this trade-off is the physical and economic reality for memory ICs as they are presently made by all manufacturers.

The capacity of DRAM circuits increases by a factor of four from one generation to the next; e.g. 1 bit, 4 bit, 16 Mbit and 64 Mbit DRAMs. This four times increase in circuit memory capacity per generation has resulted in larger and larger DRAM circuit areas. Upon introduction of a new DRAM generation the circuit yields are too low and, therefore, not cost effective for high volume manufacture. It is normally several years between the date prototype samples of a new DRAM generation are shown and the date such circuits are in volume production.

Assembling die in a stacked or three dimensional (3D) manner is disclosed in U.S. Pat. No. 5,354,695 of the present inventor, incorporated herein by reference. Furthermore, assembling die in a 3D manner has been attempted with regard to memory. Texas Instruments of Dallas Tex., Irvine Sensors of Costa Mesa Calif. and Cubic Memory Corporation of Scotts Valley Calif. have all attempted to produce stacked or 3D DRAM products. In all three cases, conventional DRAM circuits in die form were stacked and the interconnect between each DRAM in the stack was formed along the outside surface of the circuit stack. These products have been available for the past several years and have proved to be too expensive for commercial applications, but have found some use in space and military applications due to their small physical size or footprint.

The DRAM circuit type is referred to and often used as an example in this specification, however, this invention is clearly not limited to the DRAM type of circuit. Undoubtedly memory cell types such as EEPROMs (Electrically Erasable Programmable Read Only Memories), flash EPROM, Ferroelectric, GMR Giant Magneto Resistance or combinations (intra or inter) of such memory cells can also be used with the present Three Dimensional Structure (3DS) methods to form 3DS memory devices.

The present invention furthers, among others, the following objectives:

1. Several-fold lower fabrication cost per megabyte of memory than circuits conventionally made solely with monolithic circuit integration methods.
2. Several-fold higher performance than conventionally made memory circuits.
3. Many-fold higher memory density per IC than conventionally made memory circuits.
4. Greater designer control of circuit area size, and therefore, cost.
5. Circuit dynamic and static self-test of memory cells by an internal controller.

6. Dynamic error recovery and reconfiguration.
7. Multi-level storage per memory cell.
8. Virtual address translation, address windowing, various address functions such as indirect addressing or content addressing, analog circuit functions and various graphics acceleration and microprocessor functions.

SUMMARY OF THE INVENTION

The present 3DS memory technology is a stacked or 3D circuit assembly technology. Features include:
1. Physical separation of the memory circuits and the control logic circuit onto different layers;
2. The use of one control logic circuit for several memory circuits;
3. Thinning of the memory circuit to less than about 50 μm in thickness forming a substantially flexible substrate with planar processed bond surfaces and bonding the circuit to the circuit stack while still in wafer substrate form; and
4. The use of fine-grain high density inter layer vertical bus connections.

The 3DS memory manufacturing method enables several performance and physical size efficiencies, and is implemented with established semiconductor processing techniques. Using the DRAM circuit as an example, a 64 Mbit DRAM made with a 0.25 μm process could have a die size of 84 mm$^2$, a memory area to die size ratio of 40% and a access time of about 50 ns for 8 Mbytes of storage; a 3DS DRAM IC made with the same 0.25 μm process would have a die size of 18.6 mm$^2$, use 17 DRAM array circuit layers, a memory area to die size ratio of 94.4% and an expected access time of less than 10 ns for 64 Mbytes of storage. The 3DS DRAM IC manufacturing method represents a scalable, many-fold reduction in the cost per megabyte versus that of conventional DRAM IC manufacturing methods. In other words, the 3DS memory manufacturing method represents, at the infrastructure level, a fundamental cost savings that is independent of the process fabrication technology used.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1A:
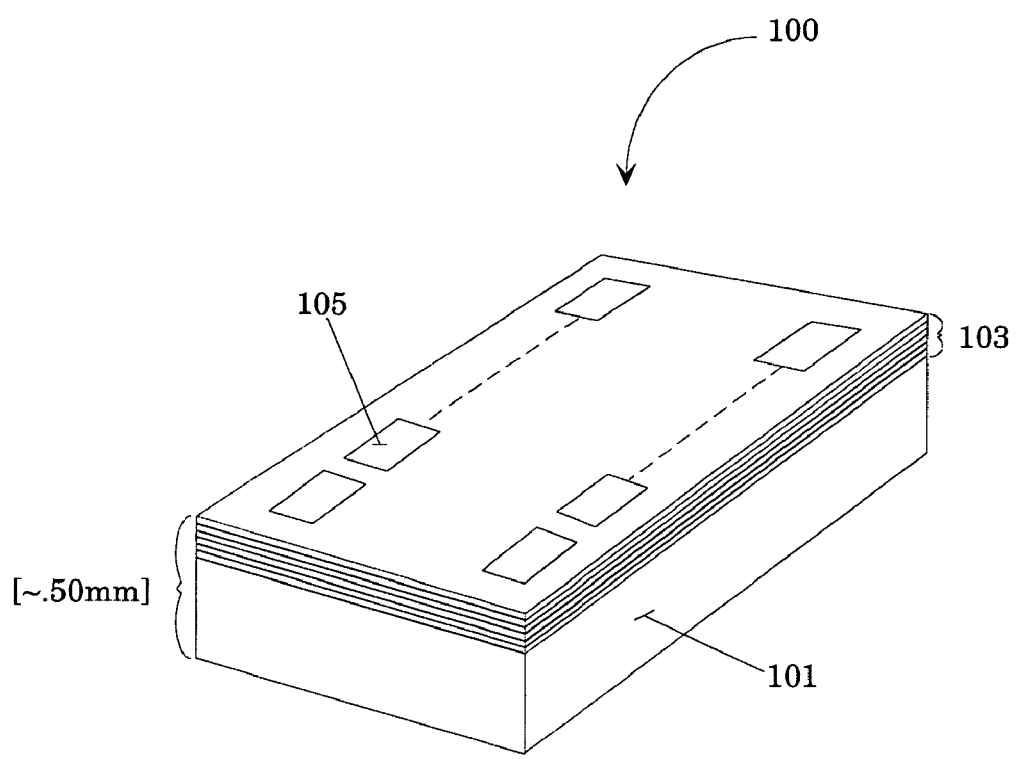
FIG. 1a is a pictorial view of a 3DS DRAM IC manufactured with Method A or Method B and demonstrating the same physical appearance of I/O bond pads as a conventional IC die.
Figure 1B:
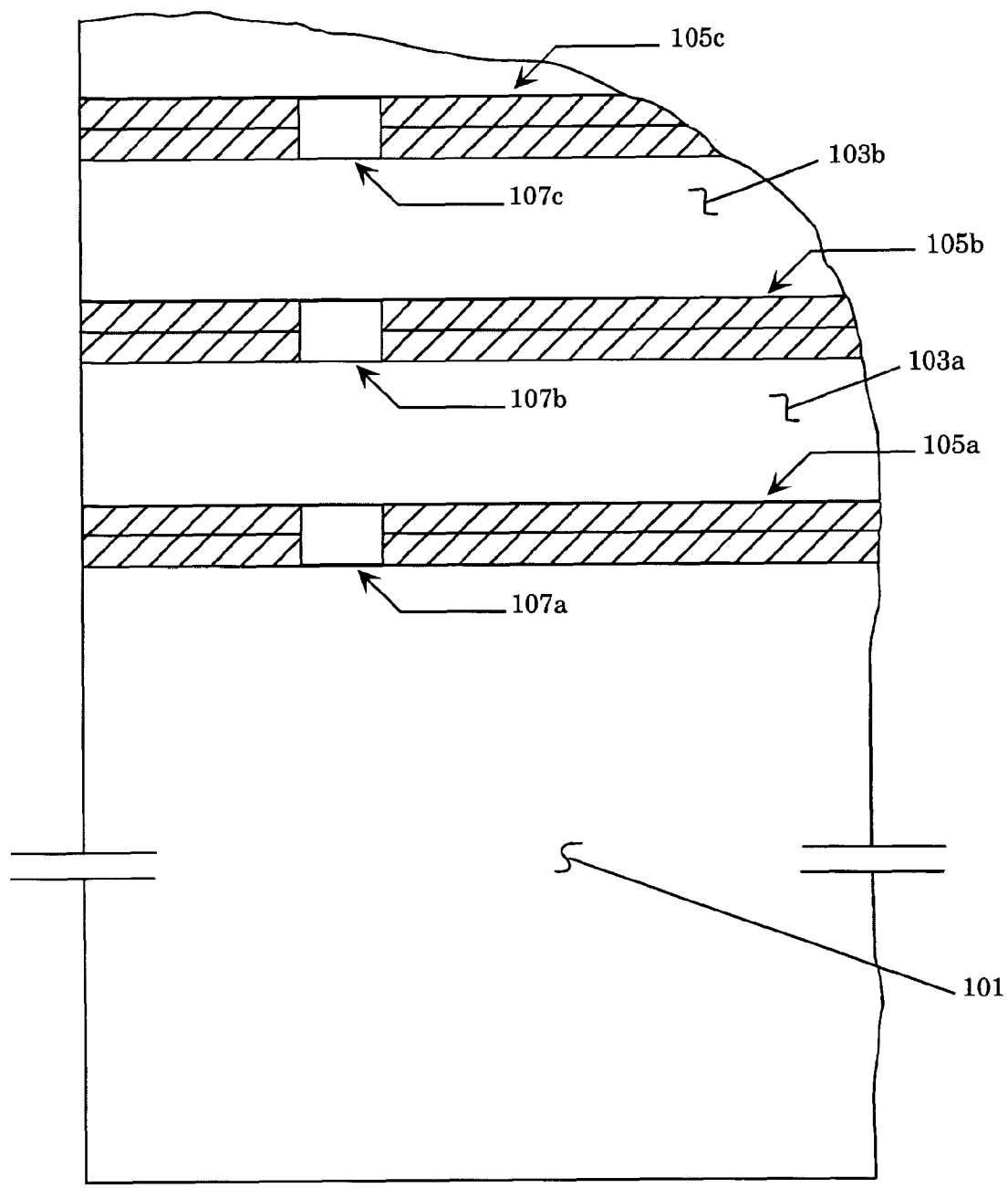
FIG. 1b is a cross-sectional view of a 3DS memory IC showing the metal bonding interconnect between several thinned circuit layers.
Figure 2A:
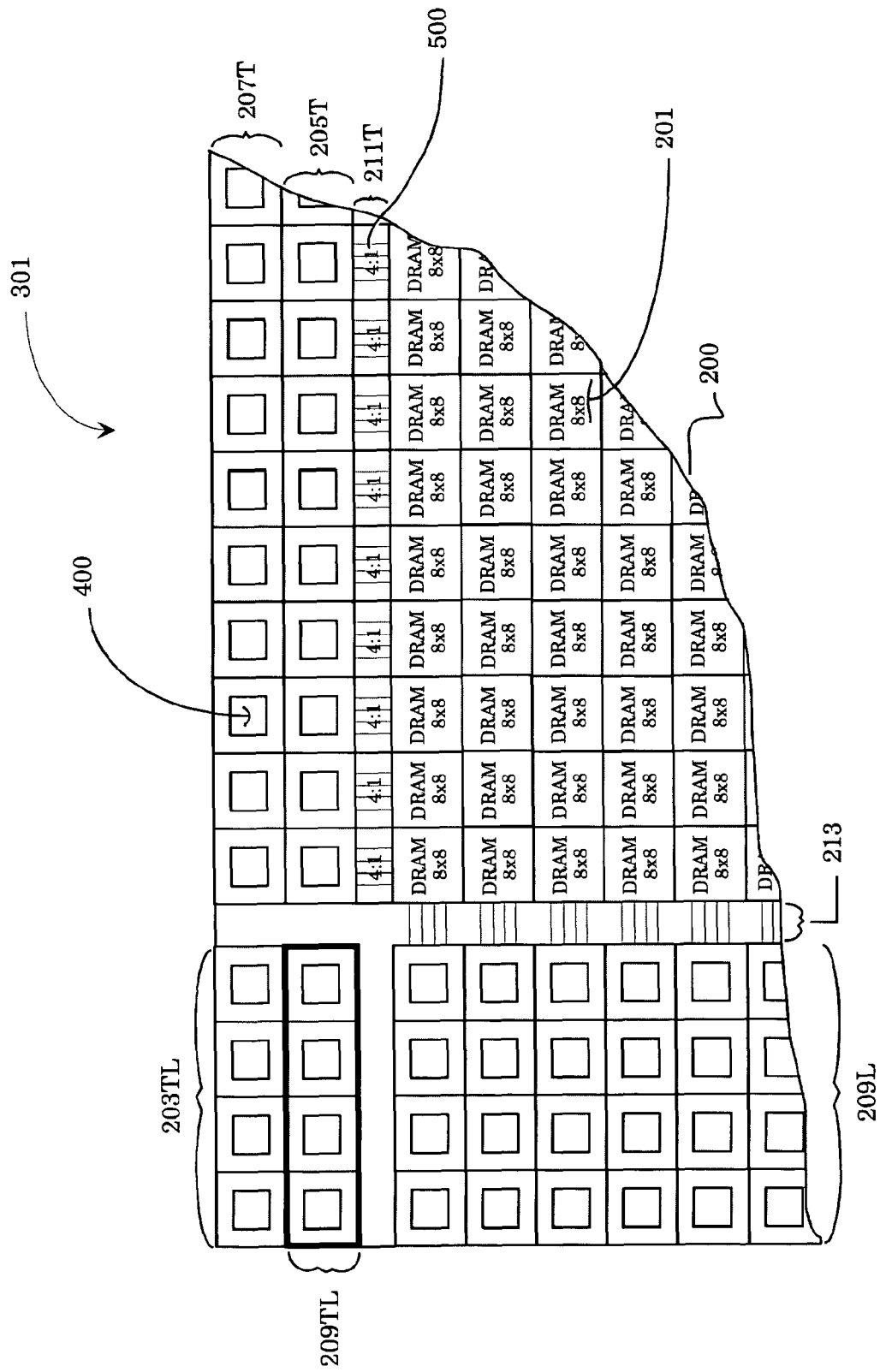
FIG. 2a is a diagram showing the physical layout of a 3DS DRAM array circuit block with one data-line set of bus lines, i.e. one port.
Figure 2B:
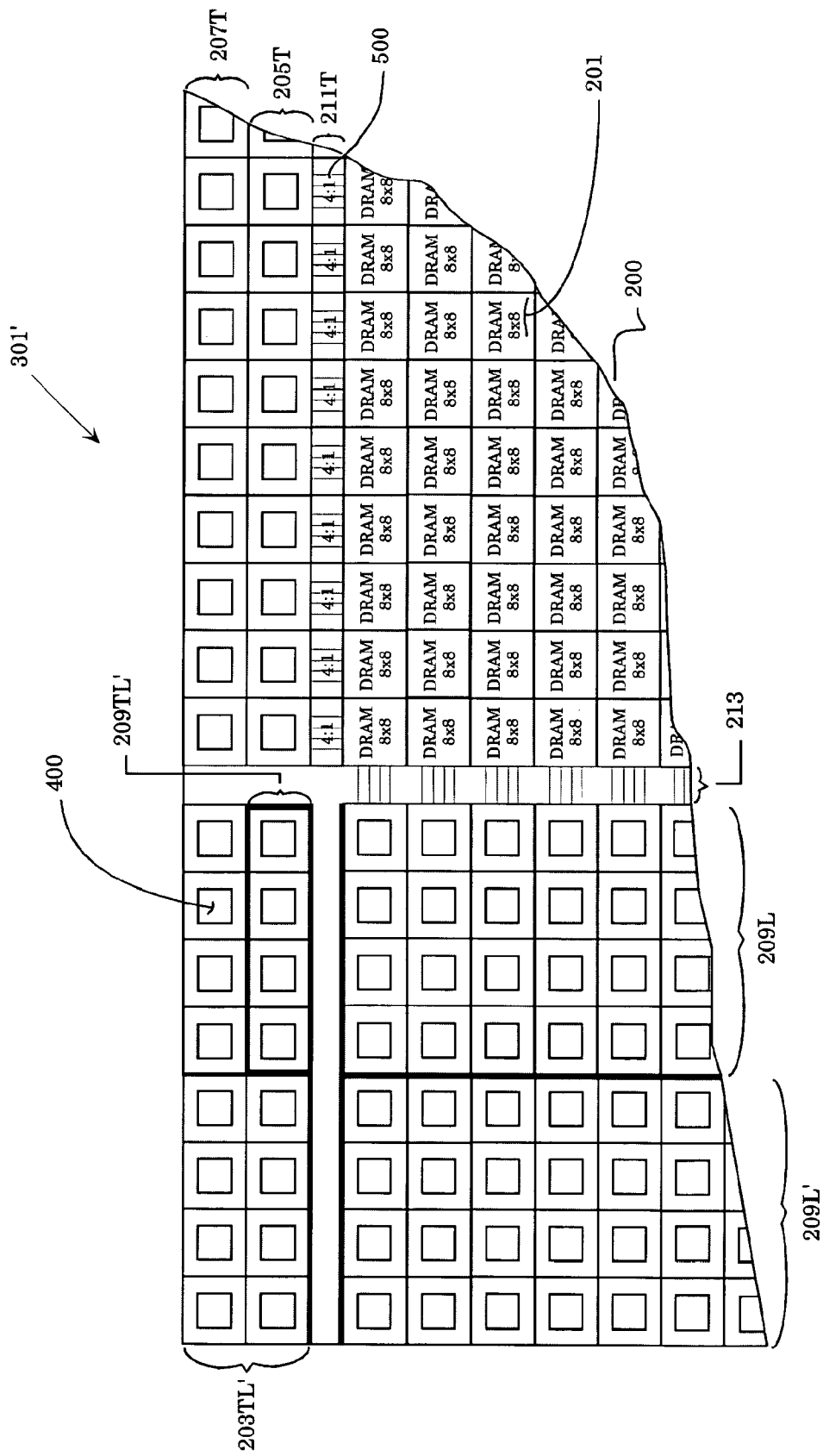
FIG. 2b is a diagram showing the physical layout of a 3DS DRAM array circuit block with two sets of data-line bus lines, i.e. two ports.

Referring to FIG. 1a and FIG. 1b, the 3DS (Three Dimensional Structure) memory device 100 is a stack of integrated circuit layers with fine-grain vertical interconnect between all circuit layers. The term fine-grain inter-layer vertical interconnect is used to mean electrical conductors that pass through a circuit layer with or without an intervening device element and have a pitch of nominally less than 100 μm and more typically less than 10 μm, but not limited to a pitch of less than 2 m, as best seen in FIG. 2a and FIG. 2b. The fine-grain inter-layer vertical interconnect also functions to bond together the various circuit layers. As shown in FIG. 1b, although the bond and interconnect layers 105a, 105b, etc., are preferably metal, other material may also be used as described more fully hereinafter.

The pattern 107a, 107b, etc. in the bond and interconnect layers 105a, 105b, etc. defines the vertical interconnect contacts between the integrated circuit layers and serves to electrically isolate these contacts from each other and the remaining bond material; this pattern takes the form of either voids or dielectric filled spaces in the bond layers.

The 3DS memory stack is typically organized as a controller circuit 101 and some number of memory array circuit layers 103, typically between nine (9) and thirty-two (32), but there is no particular limit to the number of layers. The controller circuit is of nominal circuit thickness (typically 0.5 mm or greater), but each memory array circuit layer is a thinned and substantially flexible circuit with net low stress, less than 50 μm and typically less than 10 μm in thickness. Conventional I/O bond pads are formed on a final memory array circuit layer for use with conventional packaging methods. Other metal patterns may be used such as insertion interconnection (disclosed in U.S. Pat. Nos. 5,323,035 and 5,453,404 of the present inventor), DCA (Direct Chip Attach) or FCA (Flip-Chip Attach) methods.

Figure 1C:
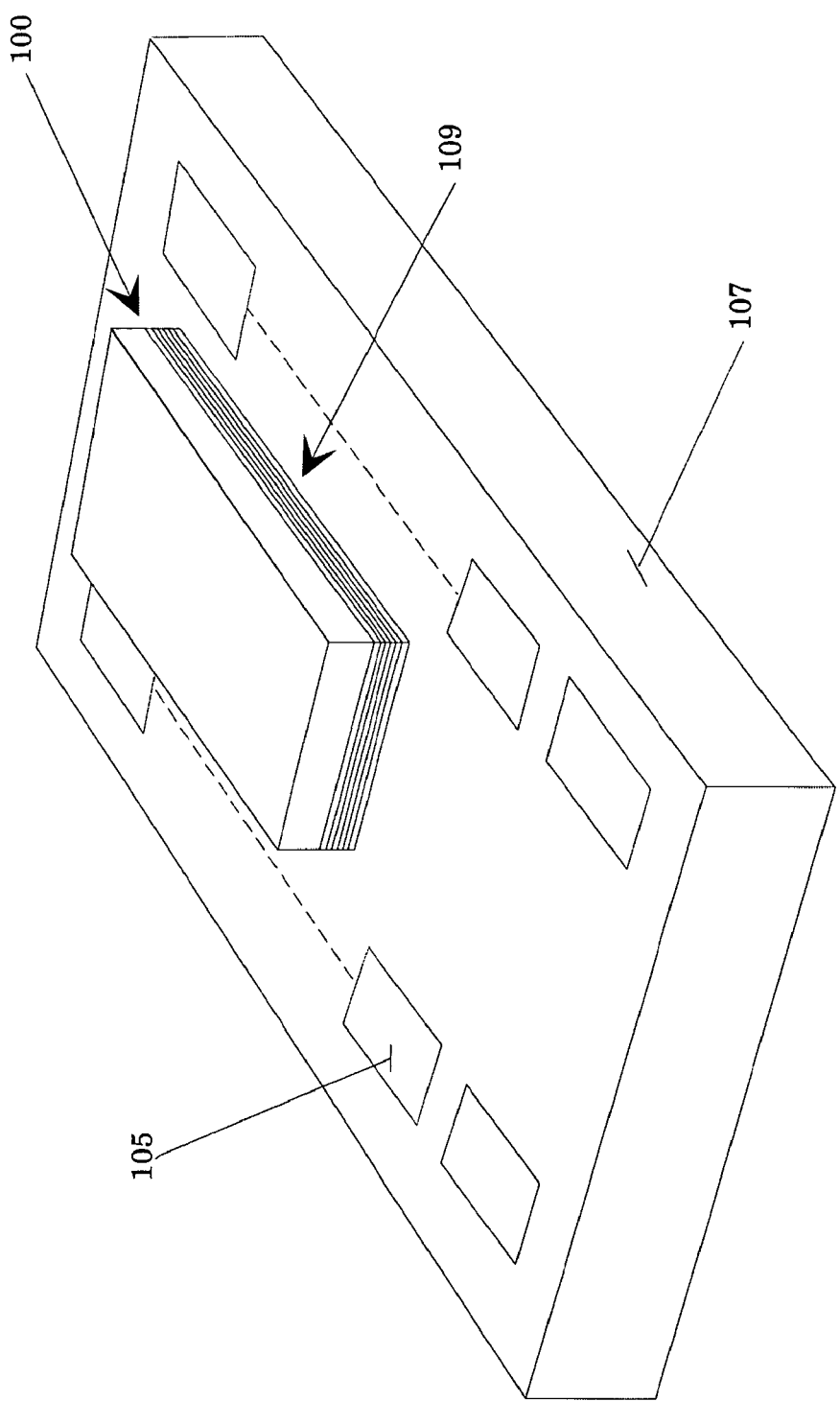
FIG. 1c is a pictorial view of a 3DS DRAM IC stack bonded and interconnected face-down onto a larger conventional IC or another 3DS IC.

Further, the fine grain inter-layer vertical interconnect can be used for direct singulated die bonding between a 3DS memory die and a conventional die (wherein the conventional die could be the controller circuit as shown in FIG. 1c) or a 3DS memory die and another 3DS memory die; it should be assumed that the areas (sizes) of the respective dice to be bonded together can vary and need not be the same. Referring more particularly to FIG. 1c, a 3DS DRAM IC stack 100 is bonded and interconnected face-down onto a larger conventional IC or another 3DS IC 107. Optionally the 3DS stack 100 can be composed of only DRAM array circuits with the DRAM controller circuitry as part of the larger die. If the DRAM controller circuitry is part of the larger die, then fine-grain vertical bus interconnect would be required (at the face 109 of the 3DS DRAM IC stack 100) to connect the 3DS DRAM array circuit to the DRAM controller, otherwise larger grain conventional interconnection could be incorporated (patterned) into the planarized bond layer.

Figure 3:
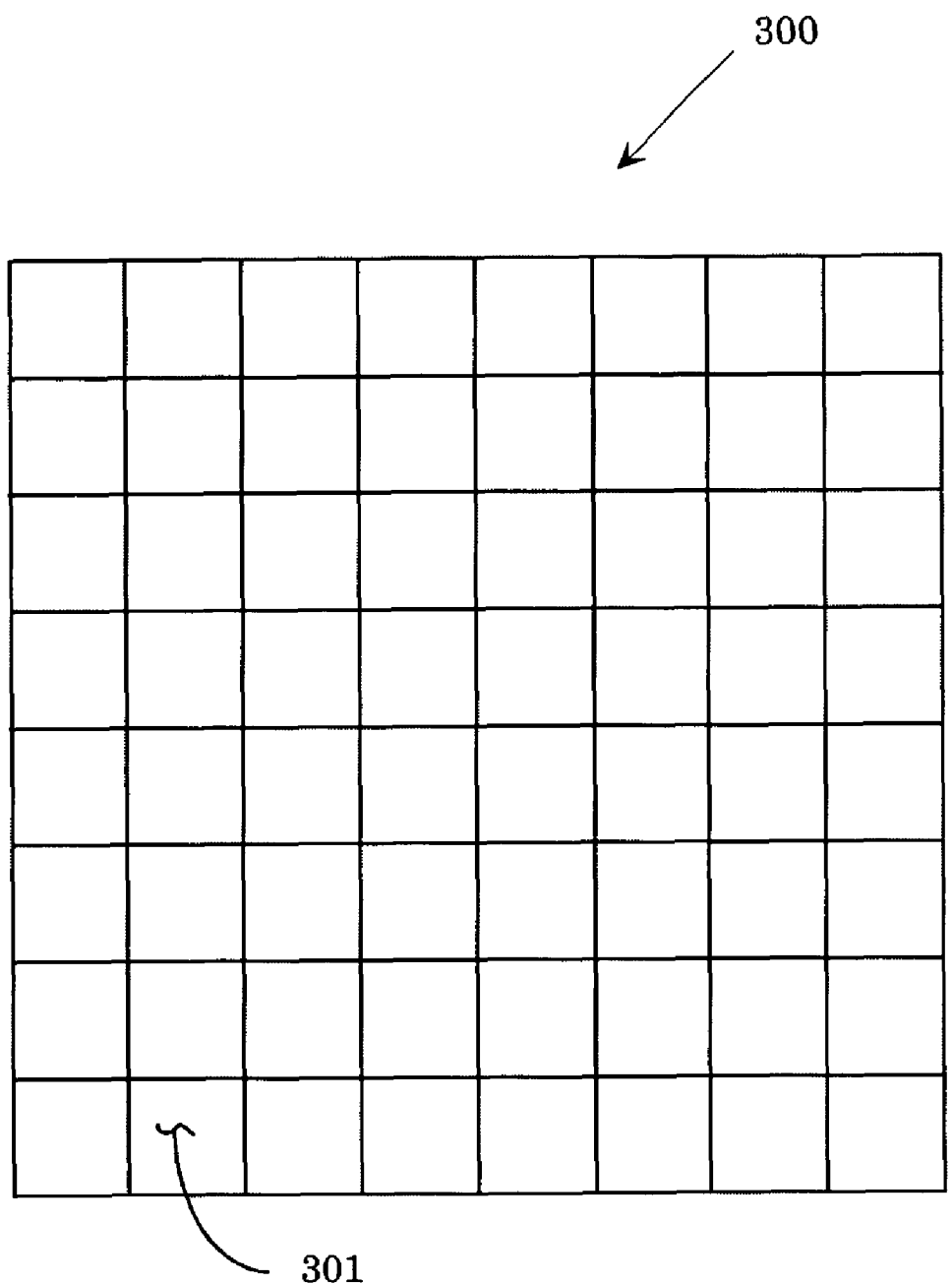
FIG. 3 is a diagram showing the physical layout of a 3DS DRAM array circuit showing partitions for sixty-four (64) 3DS DRAM array blocks.

As shown in FIG. 3, each memory array circuit layer includes a memory array circuit 300 composed of memory array blocks 301 (nominally less than 5 mm$^2$ in area) and each block is composed of memory cells (in much the same manner as the cell array of a DRAM or EEPROM circuit), busing electrodes, and—at the option of the designer—enabling gates for selection of specific rows or columns of the memory array. The controller circuit is composed of sense amps, address, control and drive logic that would normally be found at the periphery of a typical memory circuit of monolithic design such as in a conventional DRAM.

Fine-grain busing vertically connects the controller independently to each memory array layer such that the controller can provide drive (power) or enable signals to any one layer without affecting the state of any of the other layers. This allows the controller to test, read or write independently each of the memory circuit layers.

FIG. 2a and FIG. 2b show examples of layouts of possible blocks of a memory array such as the block 301 of FIG. 3. Although only a portion of the block is shown, in the illustrated embodiment, the blocks exhibit bilateral symmetry such that the layout of the complete block may be ascertained from the illustrated portion. Abbreviations "T", "L", and "TL" are used following various reference numerals to indicate "Top", "Left" and "Top-Left," respectively, implying corresponding elements not shown in the figure. Referring to FIG. 2a, a core portion 200 of the block is composed of a "sea" of memory cells. Logically, the aggregation of memory cells may be subdivided into "macrocells" 201 each containing some number of memory cells, e.g. an 8×8 array of 64 memory cells. At the periphery of the core is formed fine-grain vertical interconnect comprising inter-layer bond and bus contact metallizations 400, described in greater detail hereinafter with reference to FIG. 4. The fine-grain vertical interconnect includes I/O power and ground bus lines 203TL, memory circuit layer selects 205T, memory macro cell column selects 207T, data lines 209L, and gate-line multiplexer ("mux") selects 209TL. Gate-line multiplexers 211T are, in the illustrated embodiment, 4:1 multiplexers used to select one of four columns within an eight-wide memory macro cell column. Corresponding bottom-side 4:1 multiplexers combine with the topside multiplexers 211T to form equivalent 8:1 multiplexers for selecting a single gate-line from an eight-gate-line-wide memory macro cell column.

Figure 5:
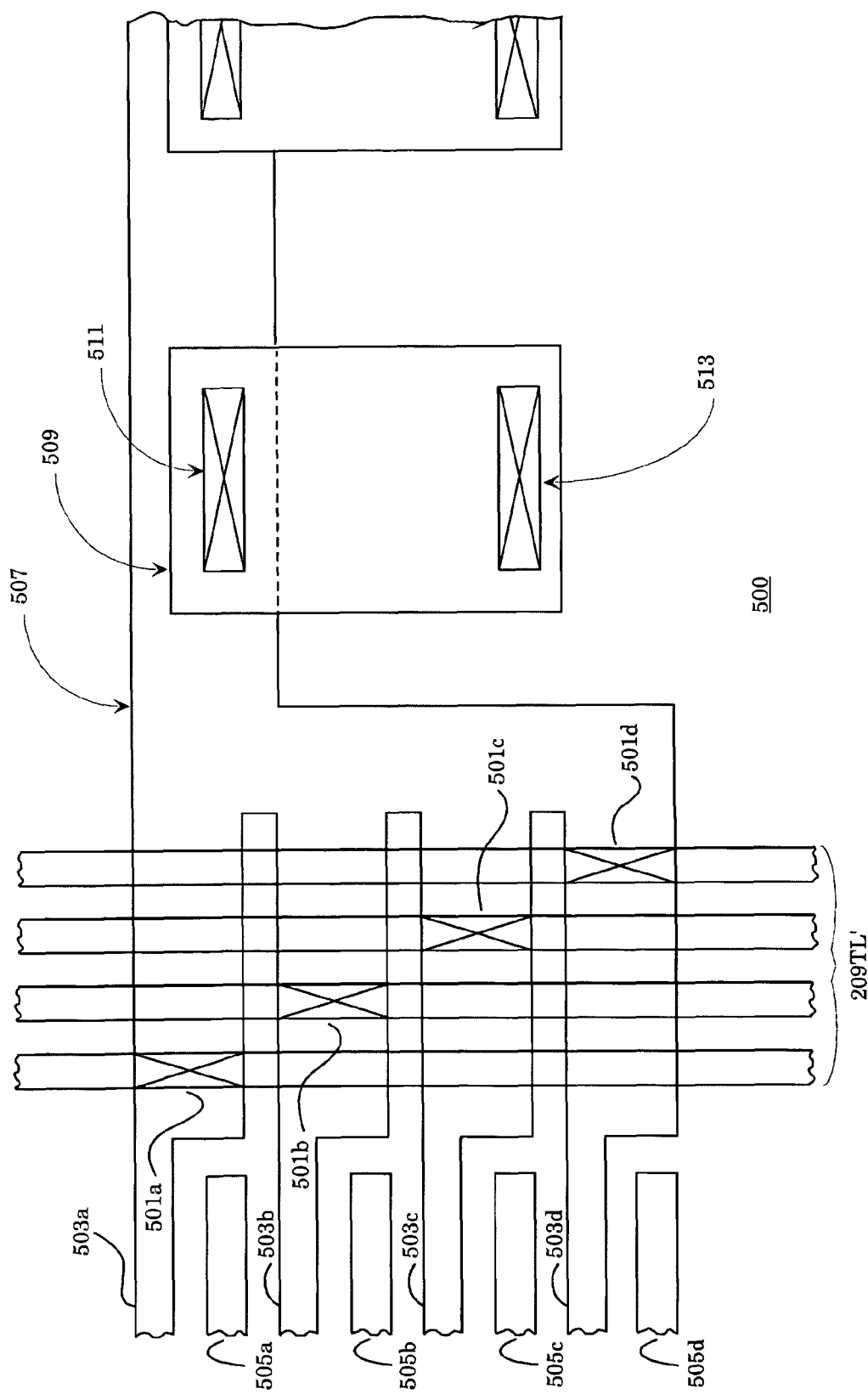
FIG. 5 is a diagram showing the layout of a 3DS memory multiplexer for down-selecting gate-line read or write selection.

One implementation of a 4:1 gate-line bus multiplexer 500 is shown in FIG. 5. Gate-line enables 209TL' (formed in a Metal-1 layer, for example) control transistors 501a through 501d, respectively. Coupled to the transistors are respective gate lines 503a through 503d. Also partly visible are gate-lines 505a through 505d which are coupled to a corresponding 4:1 multiplexer (not shown). When one of the gate-line enables is active, the corresponding gate-line is coupled to an output line 507 of the multiplexer (formed in a Metal-2 layer, for example). The output line is connected to one or more vertical bus connects through a line 509 (formed in a Metal-3 layer and corresponding to metal contact 400 of vertical bus interconnect, for example) and tungsten plugs 511 and 513. The tungsten plug 513 joins the line 509 to a vertical interconnect (not shown).

Referring again to FIG. 2a, in the case of a memory circuit layer, the layer may also include output line enables (gates) from controller layer enable signals 205T, for which I/O enables (gates) 213 may be provided.

Note that at the memory layer level, each memory block 301 is electrically isolated from every other memory block 301. Accordingly, the yield probability for each memory block is independent.

Additional read/write ports can be added as can additional gate-line vertical interconnections; additional vertical interconnection can be used in a redundant manner to improve vertical interconnect yield. The 3DS memory circuit can be designed to have one or more data read and write bus port interconnections. Referring to FIG. 2b, a memory block 301' is shown as having a port $P_0$, (209L) and a further port $P_1$ (209L'). The only limitation on the number of vertical interconnections is the overhead such vertical interconnections impose on the cost of the circuit. The fine-grain vertical interconnect method allows thousands of interconnects per block at an increase in die area of only a few percent.

As an example, the overhead of the vertical interconnect shown in FIG. 2b for a DRAM memory block of 4 bits with two read/write ports and implemented in 0.35 cm or 0.15 μm design rules consists of approximately 5,000 connections and is less than 6% of the total area of the memory array block. Therefore, the vertical interconnect overhead for each memory array circuit layer in the 3DS DRAM circuit is less than 6%. This is significantly less than that presently experienced in monolithic DRAM circuit designs where the percentage of non-memory cell area can exceed 40%. In a completed 3DS DRAM circuit the percentage of non-memory cell area is typically less than 10% of the total area of all circuits in the stacked structure.

The 3DS memory device decouples control functions that normally would be found adjacent the memory cells of monolithic memory circuits and segregates them to the controller circuit. The control functions, rather than occurring on each memory array layer as in conventional memory ICs, occur only once in the controller circuit. This creates an economy by which several memory array layers share the same controller logic, and therefore, lowers the net cost per memory cell by as much as a factor of two versus conventional memory design.

The segregation of the control functions to a separate controller circuit allows more area for such functions (i.e., an area equal to the area one or several of the memory array blocks). This physical segregation by function also allows fabrication process segregation of the two very different fabrication technologies used for the control logic and the memory array, again realizing additional fabrication cost savings versus the more complicated combined logic/memory fabrication process used for conventional memory. The memory array can also be fabricated in a process technology without consideration of the process requirements of control logic functions. This results in the ability to design higher performance controller functions at lower cost than is the case with present memory circuits. Furthermore, the memory array circuit can also be fabricated with fewer process steps and nominally reduce memory circuit fabrication costs by 30% to 40% (e.g., in the case of a DRAM array, the process technology can be limited to NMOS or PMOS transistors versus CMOS).

Hence, although bonding of sufficiently planar surfaces of a memory controller substrate and a memory array substrate using thermal diffusion metal bonding is preferred, in the broader aspects of the present invention, the invention contemplates bonding of separate memory controller and memory array substrates by any of various conventional surface bonding methods, such as anisotropically conductive epoxy adhesive, to form interconnects between the two to provide random access data storage.

Figure 2C:
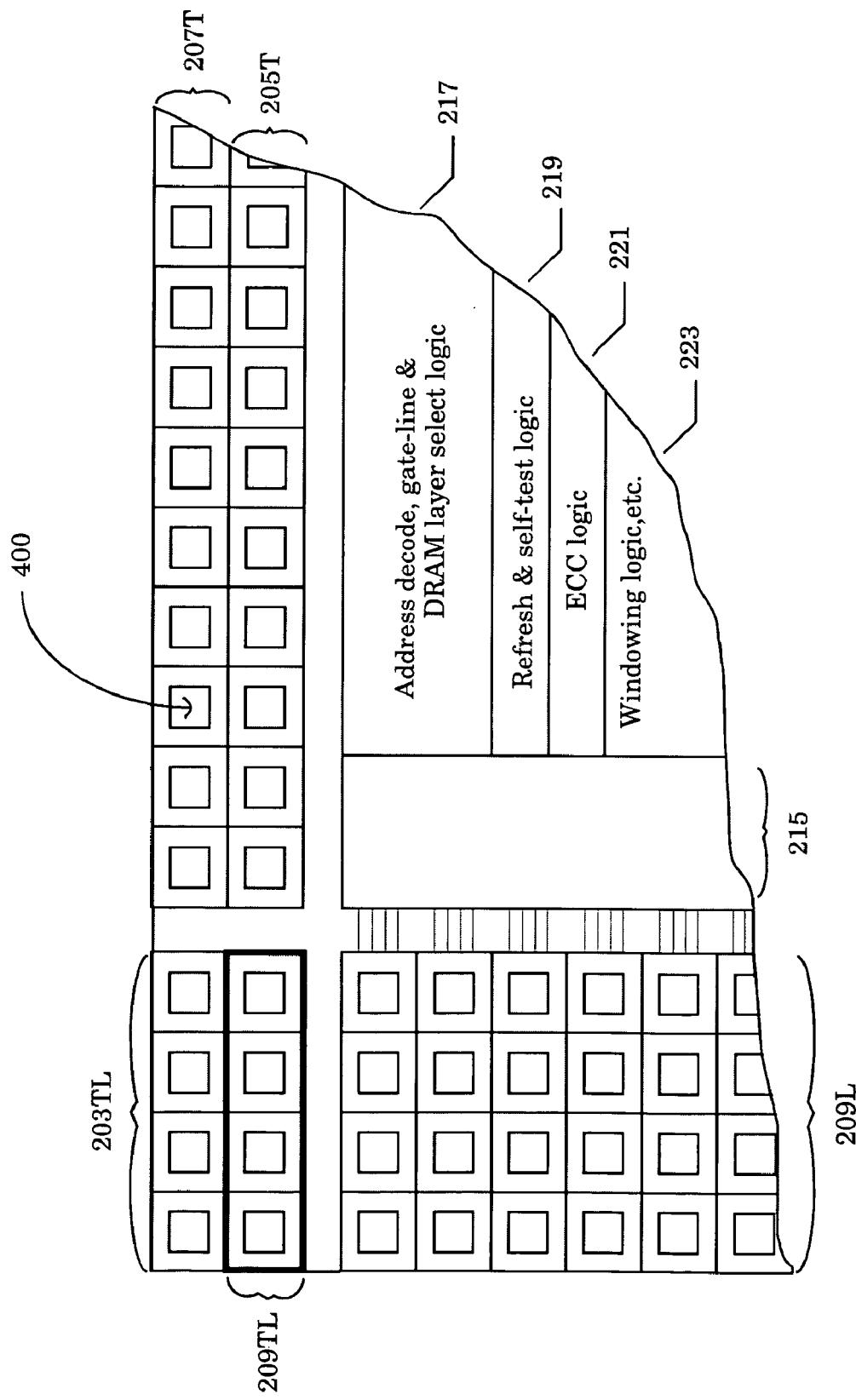
FIG. 2c is a diagram showing the physical layout of a portion of an exemplary memory controller circuit.

Referring to FIG. 2c, the layout of a portion of an exemplary memory controller circuit is shown. The inter-layer bond and bus contact metallization has the same pattern as previously described in relation to FIG. 2a. Instead of a sea of memory cells, however, there is provided memory controller circuitry including, for example, sense amps and data line buffers 215. Because of the increased availability of die area, multi-level logic may be provided in conjunction with the sense amps and data line buffers 215. Also shown are address decode, gate-line and DRAM layer select logic 217, refresh and self-test logic 219, ECC logic 221, windowing logic 223, etc. Note that self-test logic, ECC logic, and windowing logic are provided in addition to functions normally found within a DRAM memory controller circuit. Depending on die size or the number of controller circuit layers used, any of numerous other functions may also be provided including, for example, virtual memory management, address functions such as indirect addressing or content addressing, data compression, data decompression, audio encoding, audio decoding, video encoding, video decoding, voice recognition, handwriting recognition, power management, database processing, graphics acceleration functions, microprocessor functions (including adding a microprocessor substrate), etc.

The size of the 3DS memory circuit die is not dependent on the present constraint of containing the necessary number of memory cells and control function logic on one monolithic layer. This allows the circuit designer to reduce the 3DS circuit die size or choose a die size that is more optimal for the yield of the circuit. 3DS memory circuit die size is primarily a function of the size and number of memory array blocks and the number of memory array layers used to fabricate the final 3DS memory circuit. (The yield of a nineteen (19) layer, 0.25 µm process 3DS DRAM memory circuit may be shown to be greater than 90% as described below.) This advantage of selecting the 3DS circuit die size enables an earlier first production use of a more advanced process technology than would normally be possible for conventional monolithic circuit designs. This, of course, implies additional cost reductions and greater performance over the conventional memory circuits.

3DS Memory Device Fabrication Methods

There are two principal fabrication methods for 3DS memory circuits. The two 3DS memory fabrication methods, however, have a common objective which is the thermal diffusion metal bonding (also referred to as thermal compression bonding) of a number of circuit substrates onto a rigid supporting or common substrate which itself may optionally also be a circuit component layer.

The supporting or common substrate can be a standard semiconductor wafer, a quartz wafer or a substrate of any material composition that is compatible with the processing steps of the 3DS circuit, the operation of the circuit and the processing equipment used. The size and shape of the supporting substrate is a choice that best optimizes available manufacturing equipment and methods. Circuit substrates are bonded to the supporting substrate and then thinned through various methods. Circuit substrates may be formed on standard single crystal semiconductor substrates or as polysilicon circuits formed on an appropriate substrate such as silicon or quartz. Polysilicon transistor circuits have the important cost saving option of incorporating a parting layer (film) that allows the substrate upon which the polysilicon circuits are formed to be released and reused. Polysilicon transistor or TFTs (Thin Film Transistor) devices are widely used, and need not be made solely from silicon.

The various circuit layers of the 3DS memory circuit are bonded together by use of thermal diffusion of two metal surfaces, typically aluminum. The surface of the circuits to be bonded are smooth and sufficiently planar as is the case with the surface of an unprocessed semiconductor wafer or a processed semiconductor wafer that has been planarized with the CMP (Chemical Mechanical Processing) method with a surface planarity of less than 1 µm and preferably less than 1,000 Å over at least the area of the surface of the circuit (formed on the substrate) to be bonded. The metal bonding material on the surfaces of the circuits to be bonded are patterned to be mirror images of each other and to define the various vertical interconnect contacts as indicated in FIG. 2a, FIG. 2b, FIG. 2c and FIG. 5. The step of bonding two circuit substrates results in simultaneously forming the vertical interconnection between the two respective circuit layers or substrates.

The thermal diffusion bonding of the circuit layers takes place preferably in an equipment chamber with controlled pressure and atmospheric components such as $N_2$ with little $H_2O$ and $O_2$ content. The bonding equipment aligns the patterns of the substrates to be bonded, presses them together with a set of programmed pressures and at one or more temperatures for a period of time as required by the type of metal used as the bonding material. The thickness of the bonding material is nominally in a range of 500 Å to 15,000 Å or greater with a preferred thickness of 1,500 Å. The initial bonding of the substrates is preferably done at lower than standard pressure such as a negative pressure between 1 torr and 740 torr depending on the design of the bond pattern. This can leave an interior negative pressure between the bonding surfaces once external atmospheric pressure is returned which further assists in the formation of the bond and enhances the reliability of the bond.

The preferred bonding material is pure aluminum or an alloy of aluminum, but it is not limited to aluminum and may include, for example, such metals as Sn, Ti, In, Pb, Zn, Ni, Cu, Pt, Au or alloys of such metals that provide acceptable surface bond diffusion capabilities at acceptable temperatures and forming periods. The bonding material is not limited to metal, and could be a combination of bonding materials, such as highly conductive polysilicon, some of which are non-conducting such as silicon dioxide, and the foregoing exemplary types of bond material choices should not be considered to be limitations on how the circuit layers can be bonded.

In the case where metal bond materials form a native surface oxide that either inhibits the forming of a satisfactory bond or may increase the resistance in the vertical interconnections formed by the bond, the oxide should be removed. The bonding equipment provides an oxide reduction capability such that bonding surfaces of the bond material are rendered without native surface oxide. The methods of forming gas atmospheres for the reduction of surface oxides are well known, and there are other methods for removing the native oxide such as sputter etching, plasma etching or ion mill etching. In the case where aluminum is used as the bonding material, it is preferred that the thin native aluminum oxide film of approximately 40 Å on the bonding surfaces be removed prior to bonding.

The thinned (substantially flexible) substrate circuit layers of the 3DS memory circuit are typically memory array circuits, however, the thinned substrate circuit layers are not limited to memory circuits. Other circuit layer types can be controller circuits, non-volatile memory such as EEPROM, additional logic circuitry including microprocessor logic and application specific logic functions such as those that support graphic or database processing, etc. The selection of such circuit layer types follows from the functional requirements of the design of the circuit and is not limited by the 3DS memory fabrication process.

The thinned (substantially flexible) substrate circuit layers are preferably made with dielectrics in low stress (less than $5 \times 10^8$ dynes/cm$^2$) such as low stress silicon dioxide and silicon nitride dielectrics as opposed to the more commonly used higher stress dielectrics of silicon oxide and silicon nitride used in conventional memory circuit fabrication. Such low stress dielectrics are discussed at length in U.S. Pat. No. 5,354,695 of the present inventor, incorporated herein by reference. The use of dielectrics with conventional stress levels could be used in the assembly of a 3DS DRAM circuit, however, if more than a few layers comprise the stacked assembly, each layer in the assembly will have to be stress balanced so that the net stress of the deposited films of a layer is less than $5 \times 10^8$ dynes/cm$^2$. The use of intrinsically low stress deposited films is the preferred method of fabrication versus the use of the method where the stress of individually deposited films are not equal but are deposited to create a net balanced lower stress.

Method A, 3DS Memory Device Fabrication Sequence

This fabrication sequence assumes that several circuit layers will be bonded to a common or support substrate and subsequently thinned in place. An example of a resulting 3DS memory circuit is shown in FIG. 1a.

1. Align and bond to the common substrate the topside of a second circuit substrate.
2A. Grind the backside or exposed surface of the second circuit substrate to a thickness of less than 50 μm and then polish or smooth the surface. The thinned substrate is now a substantially flexible substrate.

Optionally an etch stop may be incorporated in the second substrate from less than a micron to several microns below the semiconductor surface prior to device fabrication. This etch stop can be an epitaxially formed film such as GeB (described in U.S. Pat. Nos. 5,354,695 and 5,323,035 of the present inventor, incorporated herein by reference) or a low density implanted layer of $O_2$ or $N_2$ to form a buried oxide or nitride barrier etch stop layer just below the device layer on the topside of the second substrate. After a preliminary grinding of a significant portion of the backside of the substrate, the remaining portion of the backside of the second substrate is then selectively etched in a chemical bath which stops on the surface of the eptiaxial or implanted layer. Subsequent polishing and RIE steps as necessary can then be used to complete the thinning of the second substrate.

Alternately, a parting layer such as $H_2$ implanted into the topside surface of the second substrate prior to device fabrication can be used with a thermal step to crack off the majority of the backside of the second substrate, allowing its reuse.

2B. The second substrate may alternatively be a circuit formed of polysilicon transistors or TFTs over a parting layer such as aluminum, titanium, AlAs, KBr, etc. which can be activated by a specific chemical release agent. The backside of the second substrate is then removed upon activating (dissolving) the release layer and followed as needed by interconnect semiconductor processing steps.
3. Process the thinned backside of the second substrate to form vertical interconnections such as that shown in FIG. 4 with the bonded surface side of the second substrate. The backside processing typically comprises conventional semiconductor processing steps of dielectric and metal deposition, lithography and RIE, the order of which can vary to a great degree. The completion of the backside processing will also result in a patterned metal layer that is similar to the topside bond material pattern to facilitate the subsequent bonding of an additional circuit substrate, a terminal pattern such as a conventional I/O IC bond pad (wire bonding) pattern, a pattern for thermal diffusion bonding of the 3DS memory circuit to another die (either another 3DS circuit or a conventional die), or a pattern for insertion interconnection, conventional DCA (Direct Chip Attach) or FCA (Flip-Chip Attach).

Figure 4:
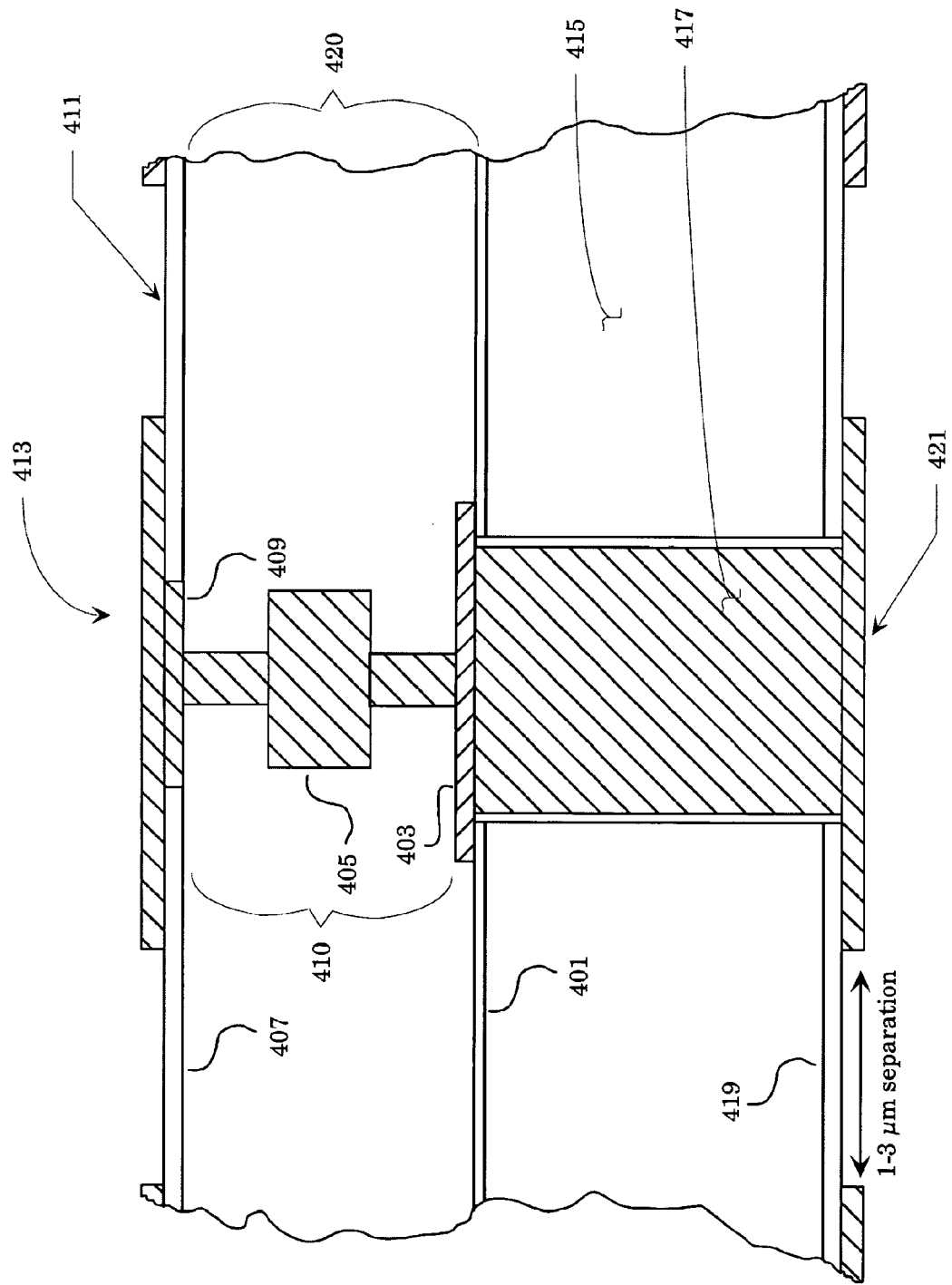
FIG. 4 is a cross-sectional view of a generic 3DS vertical interconnection or feed-through in a thinned substrate.

Referring more particularly to FIG. 4, during the fabrication of active circuit devices, an oxide mask 401 is thermally grown or deposited. Vertical bus contacts 403 are then formed, for example from highly-doped polysilicon coincident with a polysilicon gate forming step. Alternatively, contact 403 may be formed of metal. Conventional DRAM interconnect structures 410 are then formed using conventional processing. The DRAM interconnect may include an internal pad 405. The "DRAM processed" portion 420 of the wafer includes various dielectric and metal layers. A final passivation layer 407 is deposited, after which vias 409 are formed. Conventional CMP processing is then used to obtain a planar surface 411. Contacts 413 and bond surfaces not shown are then patterned in a top-most metal layer (e.g, Metal-3).

After bonding and thinning of the backside of the second substrate to about 1-8 μm of silicon (or other semiconductor) substrate 415, feed-throughs 417 are then formed in registration with the contacts 403. A passivation layer 419 and contacts 421 are then formed. The contacts 421 may be formed so as to form a mirror image of the contacts 413, allowing for the bonding of further wafers.

4. If another circuit layer is to be bonded to the 3DS circuit stack, steps 1-3 are repeated.
5A. The circuits of the finished 3DS memory substrate are then conventionally sawed into die (singulated), resulting in a circuit of the type shown in FIG. 1a, and packaged as would be the case with conventional integrated circuits.
5B. The circuits of the finished 3DS memory substrate are then conventionally sawed and then individually aligned and thermal diffusion bonded (metal pattern down) to the surface of a second (conventional IC) die or MCM substrate in a manner similar to that used in the bonding of the circuit substrates of step 1 above. (The conventional die or MCM substrate may have a larger area than the 3DS memory substrate and may include a graphics controller, video controller or microprocessor, such that the 3DS becomes embedded as part of another circuit.) This final bonding step typically incorporates a fine-grain interconnect between the 3DS memory circuit and the die or MCM substrate, but could also use a conventional interconnect pattern. Further, a 3DS memory circuit can be bonded face up to a conventional IC in die form or MCM substrate and wire bonding used to form conventional I/O interconnections.

Method B, 3DS Memory Device Fabrication Sequence

This fabrication sequence assumes that a circuit substrate will first be bonded to a transfer substrate, thinned and then bonded to a common substrate as a layer of the circuit stack. The transfer substrate is then released. This method has the advantage over Method A of allowing substrates to be thinned prior to being bonded to the final circuit stack and allows for simultaneous thinning and vertical interconnect processing of substrate circuit layers.

1. Bond to a transfer substrate a second circuit substrate using a release or parting layer. A transfer substrate may have high tolerance parallel surfaces (TTV or Total Thickness Variance of less than 1 μm) and may be perforated with an array of small holes to assist the parting process. The parting layer can be a blanket deposition of a bonding metal. Precise alignment of the surfaces is not required.
2. Perform step 2A or 2B of Method A.
3. Process the backside of the second substrate to form interconnections with the bonded topside surface of the second substrate as shown in FIG. 4. The backside processing typically comprises conventional semiconductor processing steps of dielectric and metal deposition, lithography and RIE, the order of which can vary to great degree. The completion of the backside processing will also result in a patterned metal layer that is similar to the bond material pattern of the common substrate to facilitate the subsequent bonding of an additional circuit layer.
4. Bond the second circuit to a common or support substrate (3DS stack) and release the transfer substrate by activating the parting layer between it and the second circuit.
5. Process the now exposed topside of the second substrate to form interconnections for subsequent substrate bonding or a terminal pattern for conventional I/O bonding (wire bonding) pad pattern, a pattern for thermal diffusion bonding of the 3DS memory circuit to another die (either another 3DS circuit or a conventional die), or a pattern for conventional insertion interconnect, DCA (Direct Chip Attach) or FCA (Flip-Chip Attach). If another circuit layer is to be bonded to the 3DS circuit stack, steps 1 through 4 are repeated.

6. Perform step 5A or 5B of Method A.

3DS Memory Device Yield Enhancement Methods

The 3DS circuit may be considered a vertically assembled MCM (Multi-Chip Module) and as with an MCM the final yield is the product of the yield probabilities of each component circuit (layer) in the completed 3DS circuit. The 3DS circuit uses several yield enhancement methods that are synergistic in their combined usage within a single memory IC. The yield enhancement methods used in the 3DS memory circuit include small memory array block size, memory array block electrical isolation through physically unique or separate vertical bus interconnections, intra memory array block gate-line sparing, memory array layer sparing (inter-block gate-line sparing), controller sparing and ECC (Error Correcting Codes). The term sparing is used to mean substitution by a redundant element.

The selected size of the memory array block is the first component in the yield equation for the 3DS memory circuit. Each memory array block is individually (uniquely) accessed and powered by the controller circuit and is physically independent of each and every other memory array block including those on the same memory array layer in addition to those on a different memory array layer. The size of the memory array block is typically less than 5 mm$^2$ and preferably less than 3 mm$^2$, but is not limited to a specific size. The size of memory array block, the simplicity of its NMOS or PMOS fabrication process and its physical independence from each of the other memory array blocks, for nearly all production IC processes, provides a conservatively stated nominal yield of greater than 99.5%. This yield assumes that most point defects in the memory array block such as open or shorted interconnect lines or failed memory cells can be spared (replaced) from the intra-block or inter-block set of redundant gate-lines. Major defects in a memory array block which render the complete memory array block unusable result in the complete sparing of the block from a redundant memory array layer or the rejection of the 3DS circuit.

In the example of a 3DS DRAM circuit the yield of a stack of memory array blocks is calculated from the yield equation $Y_s=((1-(1-P_y)^2)^n)_b$, where n is the number DRAM array layers, b is the number of blocks per DRAM array and $P_y$ is the effective yield (probability) of a DRAM array block less than 3 mm$^2$ in area. Assuming a DRAM array block redundancy of 4% for gate-lines in the DRAM array block lines and one redundant DRAM array layer, and assuming further that the number of blocks per layer is 64, the number of memory array layers in the stack is 17 and the effective value for Py is 0.995, then the stack yield Ys for the complete memory array (including all memory array block stacks) is 97.47%.

The Ys memory array stack yield is then multiplied by the yield of the controller Yc. Assuming a die size of less than 50 mm$^2$, a reasonable Yc for a controller fabricated from a 0.5 cm BiCMOS or mixed signal process would be between 65% and 85%, giving a net 3DS memory circuit yield of between 63.4% and 82.8%. If a redundant controller circuit layer is added to the 3DS memory stack, the yield probabilities would be between 85.7% and 95.2%.

The effective yield of a memory array block can be further increased by the optional use of ECC logic. ECC logic corrects data bit errors for some group size of data bits. The syndrome bits necessary for the operation of ECC logic would be stored on redundant gate-lines of any of the memory array layers in a vertically associated block stack. Further, if necessary, in order to accommodate the storage of ECC syndrome bits, additional memory array layers could be added to the circuit.

Advantageous 3DS Memory Device Controller Capabilities

As compared to a conventional memory circuit, the 3DS memory controller circuit can have various advantageous capabilities due the additional area available for controller circuitry and the availability of various mixed signal process fabrication technologies. Some of these capabilities are self-test of memory cells with dynamic gate-line address assignment, virtual address translation, programmable address windowing or mapping, ECC, data compression and multi-level storage.

Dynamic gate-line address assignment is the use of programmable gates to enable the layer and gate-line for a read/write operation. This allows the physical order of memory storage to be separate or different from the logical order of stored memory.

The testing of each generation of memory devices has resulted in significantly increased test costs. The 3DS memory controller reduces the cost of testing by incorporating sufficient control logic to perform an internal test (self-test) of the various memory array blocks. Circuit testing in the conventional ATE manner is required only for verification of controller circuit functions. The scope of the internal test is further extended to the programmable (dynamic) assignment of unique addresses corresponding to the various gate-lines of each memory array block on each layer. Self-test capability of the 3DS controller circuit can be used anytime during the life of the 3DS memory circuit as a diagnostic tool and as a means to increase circuit reliability by reconfiguring (sparing) the addresses of gate-lines that fail after the 3DS memory circuit is in use in a product.

ECC is a circuit capability that, if included in the controller circuit, can be enabled or disabled by a programming signal or made a dedicated function.

Data compression logic will allow the total amount of data that can be stored in the 3DS memory array to be increased. There are various generally known data compression methods available for this purpose.

Larger sense amps allow greater dynamic performance and enable higher speed read operations from the memory cells. Larger sense amps are expected to provide the capability to store more than one bit (multi-level storage) of information in each memory cell; this capability has already been demonstrated in non-volatile memory circuits such as flash EPROM. Multi-level storage has also been proposed for use in the 4 Gbit DRAM generation circuits.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of making a circuit structure comprising:
forming from a semiconductor wafer or portion thereof a first unitary substrate with a first surface;
forming from a semiconductor wafer or portion thereof a second unitary substrate with a first surface and a second surface, wherein the second surface is opposite said first surface of the second unitary substrate;

forming a dielectric layer over the first surface of at least one of the first and second unitary substrates, the dielectric layer having a stress of $5 \times 10^8$ dynes/cm$^2$ or less;

bonding the first surface of the first unitary substrate to one of the first surface and the second surface of the second unitary substrate;

thinning the second unitary substrate to form the second surface; and, forming at least one vertical interconnection, wherein the at least one vertical interconnection extends vertically through the second unitary substrate, and forming a dielectric material having a stress of about $5 \times 10^8$ dynes/cm$^2$ or less isolating the vertical interconnection from said second unitary substrate.

2. The method of claim 1, further comprising:

forming from a semiconductor wafer or portion thereof a third unitary substrate with a first surface having interconnect contacts; and bonding the first surface of the third unitary substrate to the second surface of the second unitary substrate.

3. The method of claim 2, further comprising the step of forming a connection between the at least one vertical interconnection and at least one of the interconnect contacts of the first surface of the third unitary substrate.

4. The method of claim 1, further comprising forming of interconnect contacts at least one of on, within and beneath the second surface of the second unitary substrate.

5. The method of claim 1, wherein the bonding of the first surface of the first unitary substrate to the first surface of the second unitary substrate is performed before the thinning of the second surface of the second unitary substrate.

6. The method of claim 1, wherein the bonding of the first surface of the first unitary substrate to the first surface of the second unitary substrate is performed after the thinning of the second unitary substrate.

7. The method of claim 1, wherein said at least one vertical interconnection is formed through the second unitary substrate, in whole or in part from the first surface of the second unitary substrate, or in whole or in part from the second surface of the second unitary substrate.

8. The method of claim 1, further comprising thinning the second unitary substrate to a thickness of less than 50 microns.

9. A method of making a circuit structure comprising:

forming from a semiconductor wafer or portion thereof a first unitary substrate with a first surface;

forming from a semiconductor wafer or portion thereof a second unitary substrate with a first surface and a second surface, wherein the second surface is opposite said first surface of the second unitary substrate;

bonding the first surface of the first unitary substrate to the first surface of the second unitary substrate;

thinning the second unitary substrate to form the second surface;

depositing a dielectric layer on the second surface of the second unitary substrate having a stress of about $5 \times 10^8$ dynes/cm$^2$ or less; and, forming at least one vertical interconnection, wherein the at least one vertical interconnection extends vertically through the second unitary substrate, and forming a dielectric material having a stress of about $5 \times 10^8$ dynes/cm$^2$ or less isolating the vertical interconnection from said second unitary substrate.

10. The method of claim 9, further comprising:

forming from a semiconductor wafer or portion thereof a third unitary substrate with a first surface having interconnect contacts; and bonding the first surface of the third unitary substrate to the second surface of the second unitary substrate.

11. The method of claim 10, wherein each of the first unitary substrate and the second unitary substrate is provided with interconnect contacts, further comprising the step of forming at least one vertical interconnection between at least one of: interconnect contacts of the first and the second unitary substrates; interconnect contacts of the first and the third unitary substrates; and interconnect contacts of the second and the third unitary substrates.

12. The method of claim 9, further comprising forming of interconnect contacts at least one of on, within and beneath the second surface of the second unitary substrate.

13. The method of claim 9, wherein the bonding of the first surface of the first unitary substrate to the first surface of the second unitary substrate is performed before the thinning of the second unitary substrate.

14. The method of claim 9, wherein the bonding of the first surface of the first unitary substrate to the first surface of the second unitary substrate is performed after the thinning of the second unitary substrate.

15. The method of claim 9, wherein said at least one vertical interconnection is formed through the second unitary substrate one of in whole or in part from the first surface of the second unitary substrate and one of in whole or in part from the second surface of the second unitary substrate.

16. The method of claim 9, further comprising thinning the second unitary substrate to a thickness of less than 50 microns.

17. A method of making a circuit structure comprising:

forming from a semiconductor wafer or portion thereof a first unitary substrate with a first surface;

forming from a semiconductor wafer or portion thereof a second unitary substrate with a first surface and a second surface, wherein the second surface is opposite said first surface of the second unitary substrate;

bonding the first surface of the first unitary substrate to the first surface of the second unitary substrate;

thinning the second unitary substrate to form the second surface; and, forming at least one vertical interconnection, wherein the said at least one vertical interconnection is formed in whole or in part from the first surface of the second unitary substrate, or in whole or in part from the second surface of the second unitary substrate, wherein the at least one vertical interconnection extends vertically through the second unitary substrate, and forming a dielectric material having a stress of about $5 \times 10^8$ dynes/cm$^2$ or less isolating the vertical interconnection from said second unitary substrate.

18. The method of claim 17, further comprising:

forming from a semiconductor wafer or portion thereof a third unitary substrate with a first surface having interconnections; and bonding the first surface of the third unitary substrate to the second surface of the second unitary substrate.

19. The method of claim 18, further comprising the step of forming a connection between the at least one vertical interconnection and at least one of the interconnections of first surface of the third unitary substrate.

20. The method of claim 17, further comprising forming of interconnections at least one of on, within and beneath the second surface of the second unitary substrate.

21. The method of claim 17, wherein the bonding of the first surface of the first unitary substrate to the first surface of the second unitary substrate is performed before the thinning of the second unitary substrate.

22. The method of claim 17, wherein the bonding of the first surface of the first unitary substrate to the first surface of the second unitary substrate is performed after the thinning of the second unitary substrate.

23. The method of claim 17, further comprising thinning the second unitary substrate to a thickness of less than 50 microns.

24. A method of making a circuit structure comprising:
forming from a semiconductor wafer or portion thereof a first unitary substrate with a first surface;
forming from a semiconductor wafer or portion thereof a second unitary substrate with a first surface, and a second surface, wherein the second surface is opposite said first surface of the second unitary substrate;
bonding the first surface of the first unitary substrate to one of the first surface and the second surface of the second unitary substrate;
thinning the second unitary substrate to form the second surface;
depositing a dielectric layer on the second surface of the second unitary substrate having a stress of about $5\times10^8$ dynes/cm$^2$ or less; and,
forming at least one vertical interconnection, wherein said at least one vertical interconnection is formed in whole or in part from the first surface of the second unitary substrate, or in whole or in part from the second surface of the second unitary substrate, wherein the at least one vertical interconnection extends vertically through the second unitary substrate, and forming a dielectric material having a stress of about $5\times10^8$ dynes/cm$^2$ or less isolating the vertical interconnection from said second unitary substrate.

25. The method of claim 24, further comprising:
forming from a semiconductor wafer or portion thereof a third unitary substrate with a first surface having interconnections; and
bonding the first surface of the third unitary substrate to the second surface of the second unitary substrate.

26. The method of claim 25, further comprising the step of forming a connection between the at least one vertical interconnection and at least one of the interconnections of first surface of the third unitary substrate.

27. The method of claim 24, further comprising forming of interconnections at least one of on, within and beneath the second surface of the second unitary substrate.

28. The method of claim 24, further comprising thinning the second unitary substrate to a thickness of less than 50 microns.

29. A method of making a circuit structure comprising:
forming from a semiconductor wafer or portion thereof a first unitary substrate with a first surface having one or more integrated circuits formed thereon;
forming from a semiconductor wafer or portion thereof a second unitary substrate with a first surface having one or more integrated circuits formed thereon and a second surface, wherein the second surface is opposite said first surface of the second unitary substrate;
bonding the first surface of the first unitary substrate to the one of first surface and the second surface of the second unitary substrate;
thinning the second unitary substrate to form the second surface; and,
forming at least one vertical interconnection, wherein the said at least one vertical interconnection is formed in whole or in part from the first surface of the second unitary substrate, or in whole or in part from the second surface of the second unitary substrate, wherein the at least one vertical interconnection extends vertically through the second unitary substrate, and forming a dielectric material having a stress of about $5\times10^8$ dynes/cm$^2$ or less isolating the vertical interconnection from said second unitary substrate.

30. The method of claim 29, further comprising:
forming from a semiconductor wafer or portion thereof a third unitary substrate with a first surface having one or more integrated circuits formed thereon; and bonding the first surface of the third unitary substrate to the second surface of the second unitary substrate.

31. The method of claim 30, further comprising the step of forming an interconnection between at least one of the one or more integrated circuits of the first surface of the second unitary substrate and at least one of the one or more integrated circuits of first surface of the third unitary substrate.

32. The method of claim 29, further comprising forming of interconnections at least one of on, within and beneath the second surface of the second unitary substrate.

33. The method of claim 30, further comprising forming of interconnections at least one of on, within and beneath the second surface of the third unitary substrate.

34. The method of claim 29, further comprising thinning the second unitary substrate to a thickness of less than 50 microns.

35. A method of making a circuit structure comprising:
forming from a semiconductor wafer or portion thereof a first unitary substrate with a first surface having one or more integrated circuits formed thereon and a second surface, wherein the second surface is opposite said first surface of the first unitary substrate;
thinning the first unitary substrate to form the second surface thereof;
forming from a semiconductor wafer or portion thereof a second unitary substrate with a first surface having one or more integrated circuits formed thereon and a second surface, wherein the second surface is opposite said first surface of the second unitary substrate;
thinning the second unitary substrate to form the second surface thereof;
bonding the first surface of the second unitary substrate to the second surface of the first unitary substrate; and
forming at least one vertical interconnection, wherein the at least one vertical interconnection extends vertically through the second unitary substrate, and forming a dielectric material having a stress of about $5\times10^8$ dynes/cm$^2$ or less isolating the vertical interconnection from said second unitary substrate.

36. The method of claim 35, further comprising:
forming from a semiconductor wafer or portion thereof a third unitary substrate with a first surface having one or more integrated circuits formed thereon; and
bonding the first surface of the third unitary substrate to one of the first surface of the second unitary substrate and the second surface of the second unitary substrate.

37. The method of claim 36, further comprising the step of forming an interconnection between at least one of the one or more integrated circuits of the first surface of the second unitary substrate and at least one of the one or more integrated circuits of first surface of the third unitary substrate.

38. The method of claim 35, further comprising forming of interconnections at least one of on, within and beneath the second surface of the second unitary substrate.

39. The method of claim 36, further comprising forming of interconnections at least one of on, within and beneath the second surface of the third unitary substrate.

40. The method of claim 35, further comprising depositing a dielectric layer on the second surface of the first unitary substrate, the dielectric layer having a stress of about $5\times10^8$ dynes/cm$^2$ or less.

41. The method of claim 35, further comprising depositing a dielectric layer on the second surface of the second unitary substrate, the dielectric layer having a stress of about $5\times10^8$ dynes/cm$^2$ or less.

42. The method of claim 35, further comprising thinning the first unitary substrate to a thickness of less than 50 microns.

43. The method of claim 35, further comprising thinning the second unitary substrate to a thickness of less than 50 microns.

44. A method of making a circuit structure comprising:
forming from a semiconductor wafer or portion thereof at least a first unitary substrate of a first type with a first surface having one or more integrated circuits formed thereon and a second surface, wherein the second surface is opposite said first surface of the first unitary substrate;
forming from a semiconductor wafer or portion thereof at least a first unitary substrate of a second type with a first surface having one or more integrated circuits formed thereon and a second surface, wherein the second surface is opposite said first surface of the first unitary substrate of the second type;
performing bonding of unitary substrate a surface of one of said unitary substrates to a surface of one of: another of said unitary substrates, a second unitary substrate of said first type, and a second unitary substrate of said second type;
thinning each of the first unitary substrate of the first type and the first unitary substrate of the second type by one of before performing bonding, thinning the unitary substrate to form the second surface of the unitary substrate while the first surface thereof is bonded to a support unitary substrate with an intervening release layer; and, after performing bonding, thinning the unitary substrate to form the second surface of the unitary substrate; and
forming at least one vertical interconnection that extends vertically through at least one of the first unitary substrate of the first type and the first unitary substrate of the second type, and forming a dielectric material having a stress of about $5\times10^8$ dynes/cm$^2$ or less isolating the vertical interconnection from a same unitary substrate.

45. The method of claim 44, comprising:
performing bonding of the second surface of the first unitary substrate of one of the first type and the second type to one of the first surface and the second surface of one of the first unitary substrate and a second unitary substrate of one of the first type and the second type;
wherein the second surface of the first unitary substrate of one of the first type and the second type is polished to make the unitary substrate substantially flexible.

46. The method of claim 1, comprising forming a dielectric layer over one of the surfaces of at least one of the first and second unitary substrates, the dielectric layer having a stress of $5\times10^8$ dynes/cm$^2$ or less.

47. The method of claim 46, wherein the dielectric layer comprises at least one of silicon dioxide, silicon nitride, an oxide of silicon, and a nitride of silicon.

48. The method of claim 9, comprising forming a dielectric layer over one of the surfaces of at least one of the first and second unitary substrates, the dielectric layer having a stress of $5\times10^8$ dynes/cm$^2$ or less.

49. The method of claim 48, wherein the dielectric layer comprises at least one of silicon dioxide, silicon nitride, an oxide of silicon, and a nitride of silicon.

50. The method of claim 17, comprising forming a dielectric layer over one of the surfaces of at least one of the first and second unitary substrates, the dielectric layer having a stress of $5\times10^8$ dynes/cm$^2$ or less.

51. The method of claim 50, wherein the dielectric layer comprises at least one of silicon dioxide, silicon nitride, an oxide of silicon, and a nitride of silicon.

52. The method of claim 24, comprising forming a dielectric layer over one of the surfaces of at least one of the first and second unitary substrates, the dielectric layer having a stress of $5\times10^8$ dynes/cm$^2$ or less.

53. The method of claim 52, wherein the dielectric layer comprises at least one of silicon dioxide, silicon nitride, an oxide of silicon, and a nitride of silicon.

54. The method of claim 29, comprising forming a dielectric layer over one of the surfaces of at least one of the first and second unitary substrates, the dielectric layer having a stress of $5\times10^8$ dynes/cm$^2$ or less.

55. The method of claim 54, wherein the dielectric layer comprises at least one of silicon dioxide, silicon nitride, an oxide of silicon, and a nitride of silicon.

56. The method of claim 35, comprising forming a dielectric layer over one of the surfaces of at least one of the first and second unitary substrates, the dielectric layer having a stress of $5\times10^8$ dynes/cm$^2$ or less.

57. The method of claim 56, wherein the dielectric layer comprises at least one of silicon dioxide, silicon nitride, an oxide of silicon, and a nitride of silicon.

58. The method of claim 44, comprising forming a dielectric layer over one of the surfaces of at least one of the first and second unitary substrates, the dielectric layer having a stress of $5\times10^8$ dynes/cm$^2$ or less.

59. The method of claim 58, wherein the dielectric layer comprises at least one of silicon dioxide, silicon nitride, an oxide of silicon, and a nitride of silicon.

60. The method of claim 1, wherein the dielectric material comprises at least one of silicon dioxide, silicon nitride, an oxide of silicon, and a nitride of silicon.

61. The method of claim 9, wherein the dielectric material comprises at least one of silicon dioxide, silicon nitride, an oxide of silicon, and a nitride of silicon.

62. The method of claim 17, wherein the dielectric material comprises at least one of silicon dioxide, silicon nitride, an oxide of silicon, and a nitride of silicon.

63. The method of claim 24, wherein the dielectric material comprises at least one of silicon dioxide, silicon nitride, an oxide of silicon, and a nitride of silicon.

64. The method of claim 29, wherein the dielectric material comprises at least one of silicon dioxide, silicon nitride, an oxide of silicon, and a nitride of silicon.

65. The method of claim 35, wherein the dielectric material comprises at least one of silicon dioxide, silicon nitride, an oxide of silicon, and a nitride of silicon.

66. The method of claim 44, wherein the dielectric material comprises at least one of silicon dioxide, silicon nitride, an oxide of silicon, and a nitride of silicon.

67. The method of claim 1, wherein thinning comprises parting the second unitary substrate at a parting layer.

68. The method of claim 67, wherein the parting layer comprises implanted hydrogen species.

69. The method of claim 9, wherein thinning comprises parting the second unitary substrate at a parting layer.

70. The method of claim 69, wherein the parting layer comprises implanted hydrogen species.

71. The method of claim 17, wherein thinning comprises parting the second unitary substrate at a parting layer.

72. The method of claim 71, wherein the parting layer comprises implanted hydrogen species.

73. The method of claim 24, wherein thinning comprises parting the second unitary substrate at a parting layer.

74. The method of claim 73, wherein the parting layer comprises implanted hydrogen species.

75. The method of claim 29, wherein thinning comprises parting the second unitary substrate at a parting layer.

76. The method of claim 75, wherein the parting layer comprises implanted hydrogen species.

77. The method of claim 35, wherein thinning comprises parting the second unitary substrate at a parting layer.

78. The method of claim 77, wherein the parting layer comprises implanted hydrogen species.

79. The method of claim 44, wherein thinning comprises causing the release layer to release.

80. The method of claim 79, wherein the release layer comprises implanted hydrogen species.

81. The method of claim 1, further comprising at least two of the following:
forming from a semiconductor wafer or portion thereof a third unitary substrate with a first surface having interconnect contacts, and bonding the first surface of the third unitary substrate to the second surface of the second unitary substrate; forming a connection between the at least one vertical interconnection and at least one of the interconnect contacts of the first surface of the third unitary substrate; forming of interconnect contacts at least one of on, within and beneath the second surface of the second unitary substrate; performing the bonding of the first surface of the first unitary substrate to the first surface of the second unitary substrate before the thinning of the second surface of the second unitary substrate; performing the bonding of the first surface of the first unitary substrate to the first surface of the second unitary substrate after the thinning of the second unitary substrate; wherein said at least one vertical interconnection is formed through the second unitary substrate, in whole or in part from the first surface of the second unitary substrate, or in whole or in part from the second surface of the second unitary substrate; thinning the second unitary substrate to a thickness of less than 50 microns; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

82. The method of claim 9, further comprising at least two of the following:
forming from a semiconductor wafer or portion thereof a third unitary substrate with a first surface having interconnect contacts, and bonding the first surface of the third unitary substrate to the second surface of the second unitary substrate; forming at least one vertical interconnection between at least one of: interconnect contacts of the first and the second unitary substrates, interconnect contacts of the first and the third unitary substrates, and interconnect contacts of the second and the third unitary substrates; forming of interconnect contacts at least one of on, within and beneath the second surface of the second unitary substrate; performing bonding of the first surface of the first unitary substrate to the first surface of the second unitary substrate before the thinning of the second unitary substrate; performing the bonding of the first surface of the first unitary substrate to the first surface of the second unitary substrate after the thinning of the second unitary substrate; wherein said at least one vertical interconnection is formed through the second unitary substrate one of in whole or in part from the first surface of the second unitary substrate and one of in whole or in part from the second surface of the second unitary substrate; thinning the second unitary substrate to a thickness of less than 50 microns; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

83. The method of claim 17, further comprising at least two of the following: forming from a semiconductor wafer or portion thereof a third unitary substrate with a first surface having interconnections, and bonding the first surface of the third unitary substrate to the second surface of the second unitary substrate; forming a connection between the at least one vertical interconnection and at least one of the interconnections of first surface of the third unitary substrate; forming of interconnections at least one of on, within and beneath the second surface of the second unitary substrate; performing the bonding of the first surface of the first unitary substrate to the first surface of the second unitary substrate before the thinning of the second unitary substrate; performing the bonding of the first surface of the first unitary substrate to the first surface of the second unitary substrate after the thinning of the second unitary substrate; thinning the second unitary substrate to a thickness of less than 50 microns; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

84. The method of claim 24, further comprising at least two of the following: forming from a semiconductor wafer or portion thereof a third unitary substrate with a first surface having interconnections, and bonding the first surface of the third unitary substrate to the second surface of the second unitary substrate; forming a connection between the at least one vertical interconnection and at least one of the interconnections of first surface of the third unitary substrate; forming of interconnections at least one of on, within and beneath the second surface of the second unitary substrate; thinning the second substrate to a thickness of less than 50 microns; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

85. The method of claim 29, further comprising at least two of the following: forming from a semiconductor wafer or portion thereof a third unitary substrate with a first surface having one or more integrated circuits formed thereon, and bonding the first surface of the third unitary substrate to the second surface of the second unitary substrate; forming an interconnection between at least one of the one or more integrated circuits of the first surface of the second unitary substrate and at least one of the one or more integrated circuits of first surface of the third unitary substrate; forming of interconnections at least one of on, within and beneath the second surface of the second unitary substrate; forming of interconnections at least one of on, within and beneath the second surface of the third unitary substrate; thinning the second unitary substrate to a thickness of less than 50 microns; forming a dielectric layer over a surface of at least one of the first and second unitary substrates, the dielectric layer having a stress of $5\times10^8$ dynes/cm$^2$ or less; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

86. The method of claim 35, further comprising at least two of the following: forming from a semiconductor wafer or portion thereof a third unitary substrate with a first surface having one or more integrated circuits formed thereon, and bonding the first surface of the third unitary substrate to one of the first surface of the second unitary substrate and the second surface of the second unitary substrate; forming an interconnection between at least one of the one or more integrated circuits of the first surface of the second unitary substrate and at least one of the one or more integrated circuits of first surface of the third unitary substrate; forming of interconnections at least one of on, within and beneath the second surface of the second unitary substrate; depositing a dielectric layer on the second surface of the first unitary substrate having a stress of about $5\times10^8$ dynes/cm$^2$ or less; depositing a dielectric layer on the second surface of the second unitary substrate having a stress of about $5\times10^8$ dynes/cm$^2$ or less; thinning the first unitary substrate to a thickness of less than 50 microns; thinning the second unitary substrate to a thickness of less than 50 microns; forming a dielectric layer over a surface of at least one of the first and second unitary substrates, the dielectric layer having a stress of $5\times10^8$ dynes/cm$^2$ or less; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

87. The method of claim 44, further comprising at least two of: performing bonding of the first surface of the first unitary substrate of the first type to the first surface of a second unitary substrate of the first type; performing bonding of the first surface of the first unitary substrate of the first type to the second surface of a second unitary substrate of the first type; performing bonding of the second surface of the first unitary substrate of the first type to the second surface of a second unitary substrate of the first type; thinning the second surface of the second unitary substrate of the first type before bonding; forming a dielectric layer over a surface of at least one of the first and second surfaces of the first unitary substrate of one of the first and second type, the dielectric layer having a stress of $5\times10^8$ dynes/cm$^2$ or less; forming at least one of the unitary substrates of the first and second type from a semiconductor wafer or portion thereof; wherein thinning comprises parting the first unitary substrate of one of the first type and the second type at a parting layer; wherein thinning comprises parting said first unitary substrate at a parting layer comprising implanted hydrogen species; performing at least one of polishing and Chemical Mechanical Polishing to make the first unitary substrate of one of the first type and the second type substantially flexible.

88. The method of claim 1, comprising performing at least one of polishing and Chemical Mechanical Polishing of the second surface of at least one of the first unitary substrate and the second unitary substrate to make the unitary substrate substantially flexible.

89. The method of claim 9, comprising performing at least one of polishing and Chemical Mechanical Polishing of the second surface of at least one of the first unitary substrate and the second unitary substrate to make the unitary substrate substantially flexible.

90. The method of claim 17, comprising performing at least one of polishing and Chemical Mechanical Polishing of the second surface of at least one of the first unitary substrate and the second unitary substrate to make the unitary substrate substantially flexible.

91. The method of claim 24, comprising performing at least one of polishing and Chemical Mechanical Polishing of the second surface of at least one of the first unitary substrate and the second unitary substrate to make the unitary substrate substantially flexible.

92. The method of claim 29, comprising performing at least one of polishing and Chemical Mechanical Polishing of the second unitary surface of at least one of the first unitary substrate and the second unitary substrate to make the unitary substrate substantially flexible.

93. The method of claim 35, comprising:
performing at least one of polishing and Chemical Mechanical Polishing of the second surface of the first unitary substrate to make the unitary substrate substantially flexible; and
performing at least one of polishing and Chemical Mechanical Polishing of the second surface of the second unitary substrate to make the unitary substrate substantially flexible.

94. The method of claim 44, comprising performing at least one of polishing and Chemical Mechanical Polishing of the second surface of the second unitary substrate of at least one of the first and second type to make the unitary substrate substantially flexible.

* * * * *

UNITED STATES PATENT AND TRADEMARK OFFICE
CERTIFICATE OF CORRECTION

PATENT NO. : 8,288,206 B2
APPLICATION NO. : 12/497654
DATED : October 16, 2012
INVENTOR(S) : Glenn J. Leedy It is certified that error appears in the above-identified patent and that said Letters Patent is hereby corrected as shown below:

Column 13 thru Column 22

Claims should read as follows:

What is claimed is:

1. A method of making a circuit structure comprising:
forming from a semiconductor wafer or portion thereof a first unitary substrate with a first surface;
forming from a semiconductor wafer or portion thereof a second unitary substrate with a first surface and a second surface, wherein the second surface is opposite said first surface of the second unitary substrate;
forming a dielectric layer over the first surface of at least one of the first and second unitary substrates, the dielectric layer having a stress of $5 \times 10^8$ dynes/cm$^2$ or less;
bonding the first unitary substrate and the second unitary substrate with the first surface of the first unitary substrate to facing one of the first surface and the second surface of the second unitary substrate;
thinning the second unitary substrate to form the second surface; and,
forming at least one vertical interconnection, wherein the at least one vertical interconnection extends vertically through the second unitary substrate, and forming a dielectric material having a stress of about $5 \times 10^8$ dynes/cm$^2$ or less isolating the vertical interconnection from said second unitary substrate.

2. The method of claim 1, further comprising:
forming from a semiconductor wafer or portion thereof a third unitary substrate with a first surface having interconnect contacts; and
bonding the third unitary substrate to the second unitary substrate with the first surface of the third unitary substrate to facing the second surface of the second unitary substrate.

Signed and Sealed this
Twenty-eighth Day of May, 2013

Teresa Stanek Rea
*Acting Director of the United States Patent and Trademark Office*

5. The method of claim 1, wherein the bonding ~~of~~ with the first surface of the first unitary substrate ~~to~~ facing the first surface of the second unitary substrate is performed before the thinning of the second surface of the second unitary substrate.

6. The method of claim 1, wherein the bonding ~~of~~ with the first surface of the first unitary substrate ~~to~~ facing the first surface of the second unitary substrate is performed after the thinning of the second unitary substrate.

9. A method of making a circuit structure comprising:
forming from a semiconductor wafer or portion thereof a first unitary substrate with a first surface;
forming from a semiconductor wafer or portion thereof a second unitary substrate with a first surface and a second surface, wherein the second surface is opposite said first surface of the second unitary substrate;
bonding the first unitary substrate to the second unitary substrate with the first surface of the first unitary substrate ~~to~~ facing the first surface of the second unitary substrate;
thinning the second unitary substrate to form the second surface;
depositing a dielectric layer on the second surface of the second unitary substrate having a stress of about $5 \times 10^3$ dynes/cm$^2$ or less; and,
forming at least one vertical interconnection, wherein the at least one vertical interconnection extends vertically through the second unitary substrate, and forming a dielectric material having a stress of about $5 \times 10^8$ dynes/cm$^2$ or less isolating the vertical interconnection from said second unitary substrate.

10. The method of claim 9, further comprising:
forming from a semiconductor wafer or portion thereof a third unitary substrate with a first surface having interconnect contacts; and
bonding the third unitary substrate and the second unitary substrate with the first surface of the third unitary substrate ~~to~~ facing the second surface of the second unitary substrate.

13. The method of claim 9, wherein the bonding ~~of~~ with the first surface of the first unitary substrate ~~to~~ facing the first surface of the second unitary substrate is performed before the thinning of the second unitary substrate.

14. The method of claim 9, wherein the bonding ~~of~~ with the first surface of the first unitary substrate ~~to~~ facing the first surface of the second unitary substrate is performed after the thinning of the second unitary substrate.

17. A method of making a circuit structure comprising:
forming from a semiconductor wafer or portion thereof a first unitary substrate with a first surface;
forming from a semiconductor wafer or portion thereof a second unitary substrate with a first surface and a second surface, wherein the second surface is opposite said first surface of the second unitary substrate;
bonding the first unitary substrate and the second unitary substrate with the first surface of the first unitary substrate ~~to~~ facing the first surface of the second unitary substrate;

thinning the second unitary substrate to form the second surface; and,
forming at least one vertical interconnection, wherein the said at least one vertical interconnection is formed in whole or in part from the first surface of the second unitary substrate, or in whole or in part from the second surface of the second unitary substrate, wherein the at least one vertical interconnection extends vertically through the second unitary substrate, and forming a dielectric material having a stress of about $5 \times 10^8$ dynes/cm$^2$ or less isolating the vertical interconnection from said second unitary substrate.

18. The method of claim 17, further comprising:
forming from a semiconductor wafer or portion thereof a third unitary substrate with a first surface having interconnections; and
bonding the <u>third unitary substrate and the second unitary substrate with the</u> first surface of the third unitary substrate <s>to</s><u>facing</u> the second surface of the second unitary substrate.

21. The method of claim 17, wherein the bonding <s>of</s><u>with</u> the first surface of the first unitary substrate <s>to</s><u>facing</u> the first surface of the second unitary substrate is performed before the thinning of the second unitary substrate.

22. The method of claim 17, wherein the bonding <s>of</s><u>with</u> the first surface of the first unitary substrate <s>to</s><u>facing</u> the first surface of the second unitary substrate is performed after the thinning of the second unitary substrate.

24. A method of making a circuit structure comprising:
forming from a semiconductor wafer or portion thereof a first unitary substrate with a first surface;
forming from a semiconductor wafer or portion thereof a second unitary substrate with a first surface, and a second surface, wherein the second surface is opposite said first surface of the second unitary substrate;
bonding <u>the first unitary substrate and the secondary unitary substrate with</u> the first surface of the first unitary substrate <s>to</s><u>facing</u> one of the first surface and the second surface of the second unitary substrate;
thinning the second unitary substrate to form the second surface;
depositing a dielectric layer on the second surface of the second unitary substrate having a stress of about $5 \times 10^8$ dynes/cm$^2$ or less; and,
forming at least one vertical interconnection, wherein said at least one vertical interconnection is formed in whole or in part from the first surface of the second unitary substrate, or in whole or in part from the second surface of the second unitary substrate, wherein the at least one vertical interconnection extends vertically through the second unitary substrate, and forming a dielectric material having a stress of about $5 \times 10^8$ dynes/cm$^2$ or less isolating the vertical interconnection from said second unitary substrate.

25. The method of claim 24, further comprising:
forming from a semiconductor wafer or portion thereof a third unitary substrate with a first surface having interconnections; and bonding the third unitary substrate and the second unitary substrate with the first surface of the third unitary substrate facing the second surface of the second unitary substrate.

29. A method of making a circuit structure comprising:
forming from a semiconductor wafer or portion thereof a first unitary substrate with a first surface having one or more integrated circuits formed thereon;
forming from a semiconductor wafer or portion thereof a second unitary substrate with a first surface having one or more integrated circuits formed thereon and a second surface, wherein the second surface is opposite said first surface of the second unitary substrate;
bonding the first unitary substrate and the second unitary substrate with the first surface of the first unitary substrate facing one of the first surface and the second surface of the second unitary substrate;
thinning the second unitary substrate to form the second surface; and,
forming at least one vertical interconnection, wherein the said at least one vertical interconnection is formed in whole or in part from the first surface of the second unitary substrate, or in whole or in part from the second surface of the second unitary substrate, wherein the at least one vertical interconnection extends vertically through the second unitary substrate, and forming a dielectric material having a stress of about $5 \times 10^8$ dynes/cm$^2$ or less isolating the vertical interconnection from said second unitary substrate.

30. The method of claim 29, further comprising:
forming from a semiconductor wafer or portion thereof a third unitary substrate with a first surface having one or more integrated circuits formed thereon; and bonding the third unitary substrate and the second unitary substrate with the first surface of the third unitary substrate facing the second surface of the second unitary substrate.

35. A method of making a circuit structure comprising:
forming from a semiconductor wafer or portion thereof a first unitary substrate with a first surface having one or more integrated circuits formed thereon and a second surface, wherein the second surface is opposite said first surface of the first unitary substrate;
thinning the first unitary substrate to form the second surface thereof;
forming from a semiconductor wafer or portion thereof a second unitary substrate with a first surface having one or more integrated circuits formed thereon and a second surface, wherein the second surface is opposite said first surface of the second unitary substrate;
thinning the second unitary substrate to form the second surface thereof;
bonding the first unitary substrate and the second unitary substrate with the first surface of the second unitary substrate facing the second surface of the first unitary substrate; and
forming at least one vertical interconnection, wherein the at least one vertical interconnection extends vertically through the second unitary substrate, and forming a dielectric material having a stress of about $5 \times 10^8$ dynes/cm$^2$ or less isolating the vertical interconnection from said second unitary substrate.

36. The method of claim 35, further comprising:
forming from a semiconductor wafer or portion thereof a third unitary substrate with a first surface having one or more integrated circuits formed thereon; and bonding the <u>third unitary substrate and the second unitary substrate with the</u> first surface of the third unitary substrate ~~to~~<u>facing</u> one of the first surface of the second unitary substrate and the second surface of the second unitary substrate.

44. A method of making a circuit structure comprising:
forming from a semiconductor wafer or portion thereof at least a first unitary substrate of a first type with a first surface having one or more integrated circuits formed thereon and a second surface, wherein the second surface is opposite said first surface of the first unitary substrate;
forming from a semiconductor wafer or portion thereof at least a first unitary substrate of a second type with a first surface having one or more integrated circuits formed thereon and a second surface, wherein the second surface is opposite said first surface of the first unitary substrate of the second type; ~~performing~~ bonding ~~of unitary substrate a surface of~~ one of said unitary substrates ~~to a surface of~~<u>and</u> one of: another of said unitary substrates, a second unitary substrate of said first type, and a second unitary substrate of said second type;
thinning each of the first unitary substrate of the first type and the first unitary substrate of the second type by one of<u>:</u> before performing bonding, thinning the unitary substrate to form the second surface of the unitary substrate while the first surface thereof is bonded to a support unitary substrate with an intervening release layer; and, after performing bonding, thinning the unitary substrate to form the second surface of the unitary substrate; and
forming at least one vertical interconnection that extends vertically through at least one of the first unitary substrate of the first type and the first unitary substrate of the second type, and forming a dielectric material having a stress of about $5 \times 10^8$ dynes/cm² or less isolating the vertical interconnection from a same unitary substrate.

45. The method of claim 44<u>,</u> ~~comprising: performing bonding of the second surface of the first unitary substrate of one of the first type and the second type to one of the first surface and the second surface of one of the first unitary substrate and a second unitary substrate of one of the first type and the second type;~~ wherein the second surface of the first unitary substrate of one of the first type and the second type is polished to make the unitary substrate substantially flexible~~;~~

81. The method of claim 1, further comprising at least two of the following: forming from a semiconductor wafer or portion thereof a third unitary substrate with a first surface having interconnect contacts, and bonding the <u>third unitary substrate and the second unitary substrate with the first surface of</u> the third unitary substrate ~~to~~<u>facing</u> the second surface of the second unitary substrate; forming a connection between the at least one vertical interconnection and at least one of the interconnect contacts of the first surface of the third unitary substrate; forming of interconnect contacts at least one of on, within and beneath the second surface of the second unitary substrate; performing the bonding ~~of~~<u>with</u> the first surface of the first unitary substrate ~~to~~<u>facing</u> the first surface of the second unitary substrate before the thinning of the second surface of the second unitary substrate; performing the bonding ~~of~~<u>with</u> the first surface of the first unitary substrate ~~to~~<u>facing</u> the first surface of the second unitary substrate after the thinning of the second unitary substrate; wherein said at least one vertical interconnection is formed through the second unitary substrate, in whole or in part from the first surface of the second unitary substrate, or in whole or in part from the second surface of the second unitary substrate; thinning the second unitary substrate to a thickness of less than 50 microns; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

82. The method of claim 9, further comprising at least two of the following: forming from a semiconductor wafer or portion thereof a third unitary substrate with a first surface having interconnect contacts, and bonding the third unitary substrate and the second unitary substrate with the first surface of the third unitary substrate ~~to~~ facing the second surface of the second unitary substrate; forming at least one vertical interconnection between at least one of: interconnect contacts of the first and the second unitary substrates, interconnect contacts of the first and the third unitary substrates, and interconnect contacts of the second and the third unitary substrates; forming of interconnect contacts at least one of on, within and beneath the second surface of the second unitary substrate; performing bonding ~~of~~ with the first surface of the first unitary substrate ~~to~~ facing the first surface of the second unitary substrate before the thinning of the second unitary substrate; performing the bonding ~~of~~ with the first surface of the first unitary substrate ~~to~~ facing the first surface of the second unitary substrate after the thinning of the second unitary substrate; wherein said at least one vertical interconnection is formed through the second unitary substrate one of in whole or in part from the first surface of the second unitary substrate and one of in whole or in part from the second surface of the second unitary substrate; thinning the second unitary substrate to a thickness of less than 50 microns; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

83. The method of claim 17, further comprising at least two of the following: forming from a semiconductor wafer or portion thereof a third unitary substrate with a first surface having interconnections, and bonding the third unitary substrate and the second unitary substrate with the first surface of the third unitary substrate ~~to~~ facing the second surface of the second unitary substrate; forming a connection between the at least one vertical interconnection and at least one of the interconnections of first surface of the third unitary substrate; forming of interconnections at least one of on, within and beneath the second surface of the second unitary substrate; performing the bonding ~~of~~ with the first surface of the first unitary substrate ~~to~~ facing the first surface of the second unitary substrate before the thinning of the second unitary substrate; performing the bonding ~~of~~ with the first surface of the first unitary substrate ~~to~~ facing the first surface of the second unitary substrate after the thinning of the second unitary substrate; thinning the second unitary substrate to a thickness of less than 50 microns; ; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

84. The method of claim 24, further comprising at least two of the following: forming from a semiconductor wafer or portion thereof a third unitary substrate with a first surface having interconnections, and bonding the <u>third unitary substrate and the second unitary substrate with the</u> first surface of the third unitary substrate to<u>facing</u> the second surface of the second unitary substrate; forming a connection between the at least one vertical interconnection and at least one of the interconnections of first surface of the third unitary substrate; forming of interconnections at least one of on, within and beneath the second surface of the second unitary substrate; thinning the second <u>unitary</u> substrate to a thickness of less than 50 microns; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

85. The method of claim 29, further comprising at least two of the following: forming from a semiconductor wafer or portion thereof a third unitary substrate with a first surface having one or more integrated circuits formed thereon, and bonding the <u>third unitary substrate and the second unitary substrate with the</u> first surface of the third unitary substrate to<u>facing</u> the second surface of the second unitary substrate; forming an interconnection between at least one of the one or more integrated circuits of the first surface of the second unitary substrate and at least one of the one or more integrated circuits of first surface of the third unitary substrate; forming of interconnections at least one of on, within and beneath the second surface of the second unitary substrate; forming of interconnections at least one of on, within and beneath the second surface of the third unitary substrate; thinning the second unitary substrate to a thickness of less than 50 microns; forming a dielectric layer over a surface of at least one of the first and second unitary substrates, the dielectric layer having a stress of $5 \times 10^8$ dynes/cm$^2$ or less; ; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

86. The method of claim 35, further comprising at least two of the following: forming from a semiconductor wafer or portion thereof a third unitary substrate with a first surface having one or more integrated circuits formed thereon, and bonding the <u>third unitary substrate and the second unitary substrate with the</u> first surface of the third unitary substrate to<u>facing</u> one of the first surface of the second unitary substrate and the second surface of the second unitary substrate; forming an interconnection between at least one of the one or more integrated circuits of the first surface of the second unitary substrate and at least one of the one or more integrated circuits of first surface of the third unitary substrate; forming of interconnections at least one of on, within and beneath the second surface of the second unitary substrate; depositing a dielectric layer on the second surface of the first unitary substrate having a stress of about $5 \times 10^8$ dynes/cm$^2$ or less; depositing a dielectric layer on the second surface of the second unitary substrate having a stress of about $5 \times 10^8$ dynes/cm$^2$ or less; thinning the first unitary substrate to a thickness of less than 50 microns; thinning the second unitary substrate to a thickness of less than 50 microns; forming a dielectric layer over a surface of at least one of the first and second unitary substrates, the dielectric layer having a stress of $5 \times 10^8$ dynes/cm$^2$ or less; wherein thinning comprises parting the second unitary substrate at a parting layer; wherein thinning comprises parting the second unitary substrate at a parting layer comprising implanted hydrogen species; performing at least one of polishing and Chemical Mechanical Polishing to make one of the first and second unitary substrates substantially flexible.

87. The method of claim 44, further comprising at least two of: ~~performing~~ bonding ~~of~~ <u>the first unitary substrate of the first type and a second unitary substrate of the first type with</u> the first surface of the first unitary substrate of the first type ~~to~~<u>facing</u> the first surface of ~~a~~<u>the</u> second unitary substrate of the first type; ~~performing~~ bonding ~~of~~<u>the first unitary substrate of the first type and a second unitary substrate of</u> <u>the first type with</u> the first surface of the first unitary substrate of the first type ~~to the second surface of a second unitary substrate of the first type; performing bonding of~~<u>facing</u> the second surface of the ~~first~~ <u>second</u> unitary substrate of the first type ~~to~~<u>; bonding the first unitary substrate of the first type and a</u> <u>second unitary substrate of the first type with</u><u>the second surface of the first unitary substrate of the first</u> <u>type facing</u> the second surface of ~~a~~<u>the</u> second unitary substrate of the first type; thinning the second surface of the second unitary substrate of the first type before bonding; forming a dielectric layer over a surface of at least one of the first and second surfaces of the first unitary substrate of one of the first and second type, the dielectric layer having a stress of $5 \times 10^8$ dynes/cm$^2$ or less; forming at least one of the unitary substrates of the first and second type from a semiconductor wafer or portion thereof; wherein thinning comprises parting the first unitary substrate of one of the first type and the second type at a parting layer; wherein thinning comprises parting said first unitary substrate at a parting layer comprising implanted hydrogen species; performing at least one of polishing and Chemical Mechanical Polishing to make the first unitary substrate of one of the first type and the second type substantially flexible.

92. The method of claim 29, comprising performing at least one of polishing and Chemical Mechanical Polishing of the second ~~unitary~~ surface of at least one of the first unitary substrate and the second unitary substrate to make the unitary substrate substantially flexible.